United States Patent
Xu et al.

(10) Patent No.: US 9,469,918 B2
(45) Date of Patent: Oct. 18, 2016

(54) SUBSTRATE INCLUDING A DIAMOND LAYER AND A COMPOSITE LAYER OF DIAMOND AND SILICON CARBIDE, AND, OPTIONALLY, SILICON

(71) Applicant: II-VI Incorporated, Saxonburg, PA (US)

(72) Inventors: Wen-Qing Xu, Medfield, MA (US); Elgin E. Eissler, Renfrew, PA (US); Chao Liu, Butler, PA (US); Charles D. Tanner, Saxonburg, PA (US); Charles J. Kraisinger, Saxonburg, PA (US); Michael Aghajanian, Newark, DE (US)

(73) Assignee: II-VI Incorporated, Saxonburg, PA (US)

( * ) Notice: Subject to any disclaimer, the term of this patent is extended or adjusted under 35 U.S.C. 154(b) by 17 days.

(21) Appl. No.: 14/600,592

(22) Filed: Jan. 20, 2015

(65) Prior Publication Data
US 2015/0218694 A1 Aug. 6, 2015

Related U.S. Application Data

(60) Provisional application No. 61/931,227, filed on Jan. 24, 2014.

(51) Int. Cl.
*B32B 3/02* (2006.01)
*C30B 25/02* (2006.01)
(Continued)

(52) U.S. Cl.
CPC ............... *C30B 25/02* (2013.01); *C01B 31/06* (2013.01); *C04B 35/52* (2013.01); *C04B 35/565* (2013.01);
(Continued)

(58) Field of Classification Search
CPC . C04B 41/85; C04B 41/009; C04B 41/5002; C04B 41/4531; Y10T 428/21; Y10T 428/30; Y10T 428/265; Y10T 428/24355; Y10T 428/24893; Y10T 428/24612; C23C 16/56; C23C 16/274; C23C 16/279; C23C 16/463; C23C 28/04; C23C 28/046
See application file for complete search history.

(56) References Cited

U.S. PATENT DOCUMENTS

| 4,171,339 A | 10/1979 | Lee et al. |
| 4,353,963 A | 10/1982 | Lee et al. |

(Continued)

FOREIGN PATENT DOCUMENTS

WO 2015086419 A 6/2015

OTHER PUBLICATIONS

ASTM, Standard Practice for Measuring Ultrasonic Velocity in Materials, 1995, pp. 1-14, E494, ASTM, West Conshohocken, PA, US.

(Continued)

*Primary Examiner* — Elizabeth Mulvaney
(74) *Attorney, Agent, or Firm* — The Webb Law Firm

(57) ABSTRACT

A multilayer substrate includes a diamond layer CVD grown on a composite layer. The composite layer includes particles of diamond and silicon carbide and, optionally, silicon. A loading level (by volume) of diamond in the composite layer can be ≥5%; ≥20%; ≥40%; or ≥60%. The multilayer substrate can be used as an optical device; a detector for detecting radiation particles or electromagnetic waves; a device for cutting, drilling, machining, milling, lapping, polishing, coating, bonding, or brazing; a braking device; a seal; a heat conductor; an electromagnetic wave conductor; a chemically inert device for use in a corrosive environment, a strong oxidizing environment, or a strong reducing environment, at an elevated temperature, or under a cryogenic condition; or a device for polishing or planarization of other devices, wafers or films.

17 Claims, 23 Drawing Sheets

(51) Int. Cl.

| | | |
|---|---|---|
| C04B 35/52 | (2006.01) | |
| C04B 41/85 | (2006.01) | |
| C04B 41/00 | (2006.01) | |
| C04B 41/50 | (2006.01) | |
| C23C 16/27 | (2006.01) | |
| C23C 16/46 | (2006.01) | |
| C23C 16/56 | (2006.01) | |
| C23C 28/04 | (2006.01) | |
| C01B 31/06 | (2006.01) | |
| C04B 35/565 | (2006.01) | |
| C04B 35/573 | (2006.01) | |
| C04B 35/634 | (2006.01) | |

(52) U.S. Cl.
CPC .......... *C04B 35/573* (2013.01); *C04B 35/634* (2013.01); *C04B 41/009* (2013.01); *C04B 41/5002* (2013.01); *C04B 41/85* (2013.01); *C23C 16/274* (2013.01); *C23C 16/279* (2013.01); *C23C 16/463* (2013.01); *C23C 16/56* (2013.01); *C23C 28/04* (2013.01); *C23C 28/046* (2013.01); *C04B 2235/3826* (2013.01); *C04B 2235/427* (2013.01); *C04B 2235/5427* (2013.01); *C04B 2235/5436* (2013.01); *C04B 2235/602* (2013.01); *C04B 2235/604* (2013.01); *C04B 2235/6581* (2013.01); *C04B 2235/77* (2013.01); *C04B 2235/80* (2013.01); *C04B 2235/96* (2013.01); *C04B 2235/9607* (2013.01); *Y10T 428/21* (2015.01); *Y10T 428/24355* (2015.01); *Y10T 428/24612* (2015.01); *Y10T 428/24893* (2015.01); *Y10T 428/26* (2015.01); *Y10T 428/265* (2015.01); *Y10T 428/30* (2015.01)

(56) References Cited

U.S. PATENT DOCUMENTS

| | | |
|---|---|---|
| 4,417,906 A | 11/1983 | Ohno |
| 4,428,755 A | 1/1984 | Ohno |
| 4,453,951 A | 6/1984 | Ohno |
| 4,643,741 A | 2/1987 | Yu et al. |
| 4,707,384 A | 11/1987 | Schachner et al. |
| 4,948,629 A | 8/1990 | Hacker et al. |
| 4,958,590 A | 9/1990 | Goforth |
| 4,970,986 A | 11/1990 | Anthony et al. |
| 5,010,043 A | 4/1991 | Ringwood |
| 5,015,494 A | 5/1991 | Yamazaki |
| 5,071,677 A | 12/1991 | Patterson et al. |
| 5,154,945 A | 10/1992 | Baldwin et al. |
| 5,190,823 A | 3/1993 | Anthony et al. |
| 5,250,149 A | 10/1993 | Kimoto et al. |
| 5,270,077 A | 12/1993 | Knemeyer et al. |
| 5,270,114 A | 12/1993 | Herb et al. |
| 5,286,524 A | 2/1994 | Slutz et al. |
| 5,302,231 A | 4/1994 | Bovenkerk et al. |
| 5,314,652 A | 5/1994 | Simpson et al. |
| 5,368,897 A | 11/1994 | Kurihara et al. |
| 5,391,229 A | 2/1995 | Kosky et al. |
| 5,403,399 A | 4/1995 | Kurihara et al. |
| 5,413,772 A * | 5/1995 | Pinneo ............... C01B 31/065 423/446 |
| 5,418,018 A | 5/1995 | Rudder et al. |
| 5,424,096 A | 6/1995 | Anthony et al. |
| 5,433,977 A | 7/1995 | Sarin et al. |
| 5,437,728 A | 8/1995 | Anthony et al. |
| 5,437,891 A | 8/1995 | Anthony et al. |
| 5,445,106 A | 8/1995 | Einset |
| 5,474,808 A | 12/1995 | Aslam |
| 5,479,874 A | 1/1996 | Correa |
| 5,480,686 A | 1/1996 | Rudder et al. |
| 5,491,028 A | 2/1996 | Sarin et al. |
| 5,505,158 A | 4/1996 | Thorpe, Jr. et al. |
| 5,507,987 A | 4/1996 | Windischmann |
| 5,523,121 A | 6/1996 | Anthony et al. |
| 5,523,160 A | 6/1996 | Kobashi et al. |
| 5,628,824 A | 5/1997 | Vohra et al. |
| 5,660,894 A | 8/1997 | Chen et al. |
| 5,665,430 A | 9/1997 | Doverspike et al. |
| 5,749,966 A | 5/1998 | Shates |
| 5,792,254 A | 8/1998 | Windischmann |
| 5,902,563 A | 5/1999 | Pinneo |
| 5,952,102 A | 9/1999 | Cutler |
| 6,042,886 A | 3/2000 | Matthee et al. |
| 6,110,541 A | 8/2000 | Lee et al. |
| 6,344,149 B1 | 2/2002 | Oles |
| 6,414,338 B1 | 7/2002 | Anderson |
| 6,709,747 B1 | 3/2004 | Gordeev et al. |
| 6,939,506 B2 | 9/2005 | Qian et al. |
| 6,981,465 B2 | 1/2006 | Chae |
| 7,060,641 B2 | 6/2006 | Qian et al. |
| 7,115,241 B2 | 10/2006 | Hemley et al. |
| 7,306,778 B2 | 12/2007 | Chaffin |
| 7,452,420 B2 | 11/2008 | Hemley et al. |
| 7,713,507 B2 | 5/2010 | Hemley et al. |
| 7,754,180 B2 | 7/2010 | Hemley et al. |
| 7,767,184 B2 | 8/2010 | Chaffin, III |
| 7,771,823 B2 | 8/2010 | Chaffin, III |
| 7,833,581 B2 | 11/2010 | Guo et al. |
| 7,959,841 B2 | 6/2011 | Zhao |
| 8,168,115 B2 | 5/2012 | Qian et al. |
| 8,474,362 B1 | 7/2013 | Karandikar et al. |
| 2005/0025973 A1* | 2/2005 | Slutz ............... B24B 53/017 428/408 |
| 2005/0064097 A1 | 3/2005 | Jacobus van Enckevort et al. |
| 2005/0276979 A1 | 12/2005 | Slutz et al. |
| 2006/0040104 A1 | 2/2006 | Wort et al. |
| 2008/0256850 A1 | 10/2008 | Kley |
| 2010/0116197 A1 | 5/2010 | Godfried et al. |
| 2010/0178730 A1 | 7/2010 | Noguchi |
| 2011/0283629 A1 | 11/2011 | Easley |

OTHER PUBLICATIONS

ASTM International, Standard Test Method for True Specific Gravity of Refractory Materials by Water Immersion, 1996, ( 2009 reapproved), pp. 1-3, C135, ASTM International, West Conshohocken, PA, US.

Nazare et al., Properties, Growth and Applications of Diamond, 2001, 446 total book pages, INSPEC, London, UK.

Zaitsev, Optical Properties of Diamond a Data Handbook, 2001, 508 total book pages, Springer-Verlag Berlin Heidelberg, NY, NY, US.

Asmussen et al. (Editors), Diamond Films Handbook, 2002, 688 total book pages, Marcel Dekker, Inc., NY, NY, US.

Prawer et al., Raman spectroscopy of diamond and doped diamond, The Royal Society, 2004, pp. 2537-2565, 362, Phil. Trans. R. Soc. Lond. A.

Kobashi, Diamond Films Chemical Vapor Deposition for Oriented and Heteroepitaxial Growth, 2005, 348 total book pages, Elsevier Ltd, Oxford, UK.

ASTM International, Standard Test Method for Thermal Diffusivity by the Flash Method, 2013, pp. 1-11, E1461, ASTM International, West Conshohocken, PA, US.

ASTM International, Standard Test Method for Linear Thermal Expansion of Solid Materials by Thermomechanical Analysis, 2014, pp. 1-4, E831, ASTM International, West Conshohocken, PA, US.

* cited by examiner

METHOD OF MAKING A MULTILAYER SUBSTRATE COMPRISING A LAYER OF DIAMOND AND A LAYER OF COMPOSITE COMPRISED OF PARTICLES OF DIAMOND AND SILICON CARBIDE, AND, OPTIONALLY, SILICON.

1. MAKE A COMPOSITE LAYER COMPRISED OF PARTICLES OF DIAMOND AND SILICON CARBIDE, AND OPTIONALLY, SILICON

| DIAMOND | SILICON CARBIDE (OPTIONALLY) | SILICON (OPTIONALLY) | CARBON (OPTIONALLY) | SINTERING, HOT PRESSING INFILTRATION, HTHP |

2. DEPOSIT OR BOND DIAMOND ONTO THE COMPOSITE COMPRISING DIAMOND AND SILICON CARBIDE, AND OPTIONALLY, SILICON

| MICROWAVE PLASMA CVD | HOT FILAMENT CVD | DC PLASMA CVD | COMBUSTION FLAME PLASMA CVD | RF AND VHF PLASMA CVD | LASER ASSISTED CVD | BONDING |

3. POST-PROCESSING: LAPPING, POLISHING, CUTTING, COATING, BRAZING, ASSEMBLING FOR DIFFERENT APPLICATIONS

| MECHANICAL: DRILL, CUT, MACHINE, OR MILL, ETC. | OPTICAL MANAGEMENT | THERMAL MANAGEMENT | CHEMICAL INERTNESS | FRICTION CONTROL | ELECTRO-MAGNETIC OR SOUND WAVE | WEAR COMPONENT | DETECTOR |

FIG. 2

SEM IMAGES OF (FIG. 4A) FRESH COMPOSITE COMPRISING DIAMOND, SILICON CARBIDE, AND SILICON; (FIG. 4B) AFTER 20 HOURS CHEMICAL VAPOR DEPOSITION OF DIAMOND; AND (FIG. 4C) AFTER 117 HOURS CHEMICAL VAPOR DEPOSITION OF DIAMOND.

SEM IMAGE OF THE CENTER OF DIAMOND LAYER 4 (THAT WAS DEPOSITED FOR 290 HOUR IN A MICROWAVE CVD REACTOR) ON A COMPOSITE LAYER 6 CONTAINING 70% DIAMOND (SUBSTRATE 1A175)

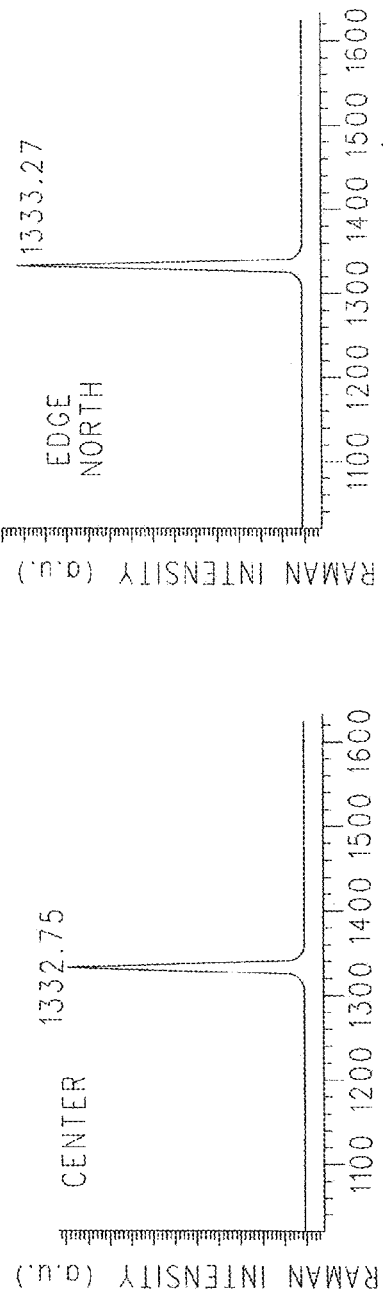
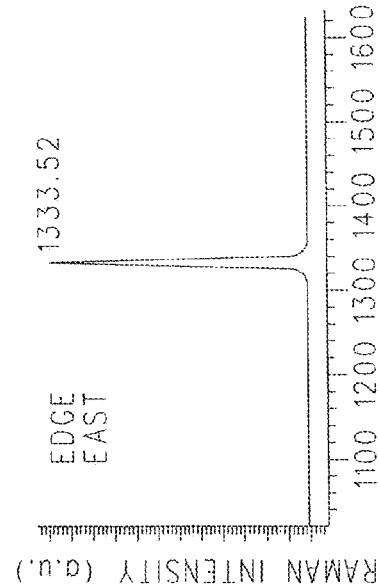

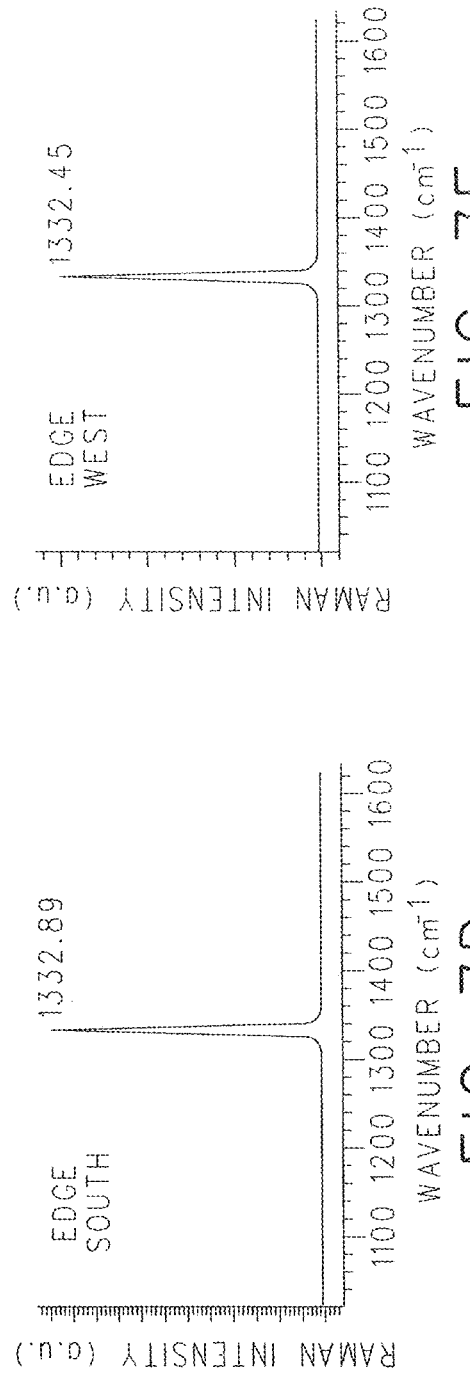
FIG. 7D / FIG. 7E
RAMAN SPECTRA OF CVD DIAMOND LAYER 4 (DEPOSITED FOR 290 HOUR IN A MICROWAVE CVD REACTOR) ON A COMPOSITE SUBSTRATE 6 CONTAINING 70% DIAMOND WITH BALANCE BEING SILICON CARBIDE, AND, OPTIONALLY, SILICON (SUBSTRATE 1A175).

SEM IMAGE OF THE CENTER OF THE GROWTH SURFACE OF THE THIN CVD DIAMOND LAYER 4 ON TUNGSTEN SUBSTRATE #124, AFTER OVERNIGHT MICROWAVE CVD DIAMOND GROWTH.

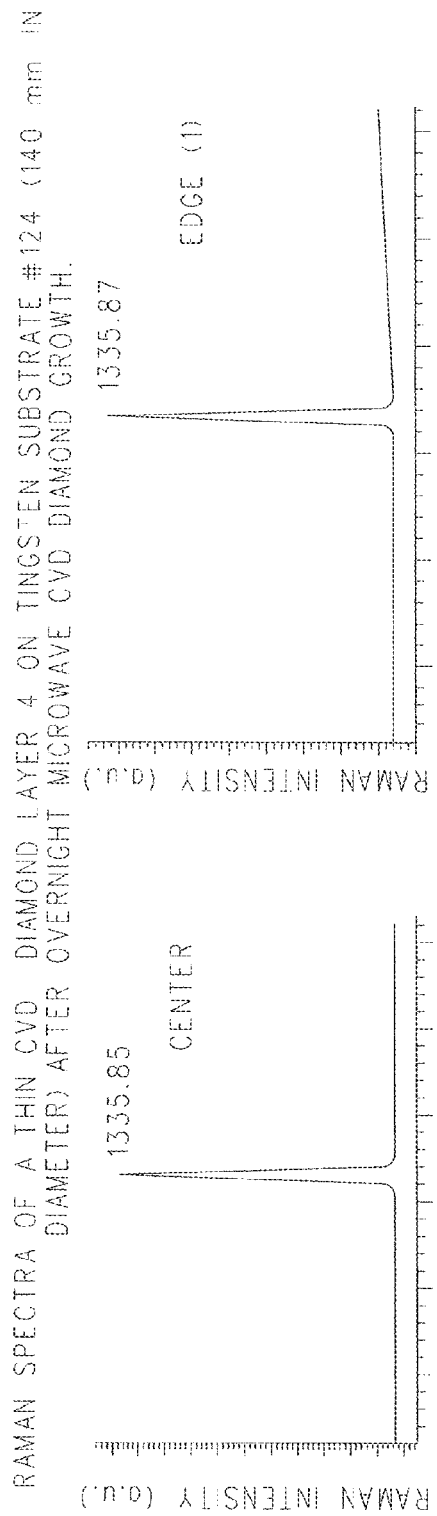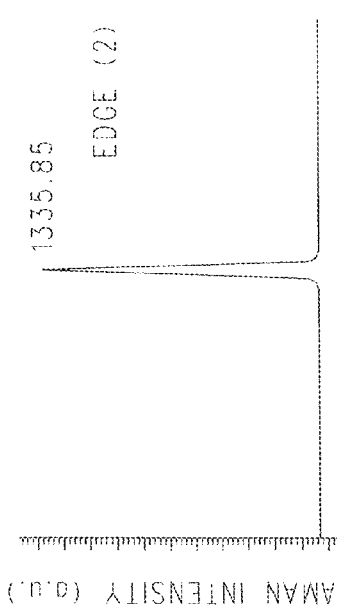
FIG. 11A
FIG. 11B
FIG. 11C

SEM IMAGE OF THE CENTER OF DIAMOND LAYER 4 (THAT WAS DEPOSITED FOR 301 HOUR IN A MICROWAVE CVD REACTOR) ON A COMPOSITE LAYER 6 CONTAINING 40% DIAMOND (SUBSTRATE IA177B).

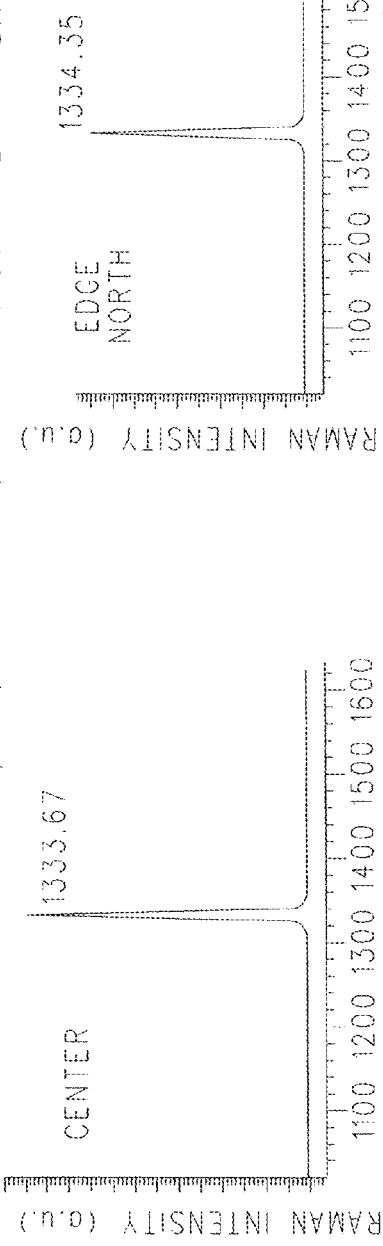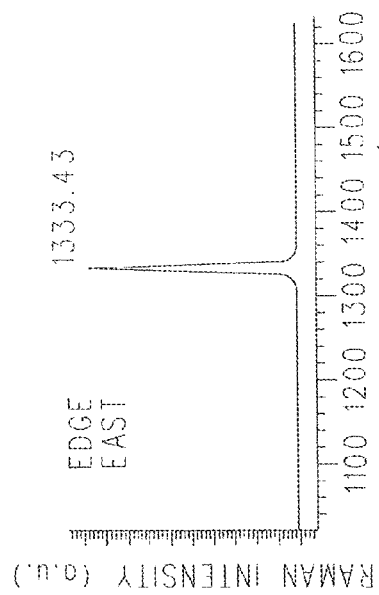
FIG. 13A — CENTER, 1333.67
FIG. 13B — EDGE NORTH, 1334.35
FIG. 13C — EDGE EAST, 1333.43
RAMAN SPECTRA OF CVD DIAMOND LAYER 4 (DEPOSITED FOR 301 HOUR IN A MICROWAVE CVD REACTOR) ON A COMPOSITE LAYER 6 CONTAINING 40% DIAMOND WITH BALANCE BEING SILICON CARBIDE, AND, OPTIONALLY, SILICON (SUBSTRATE 1A177B).

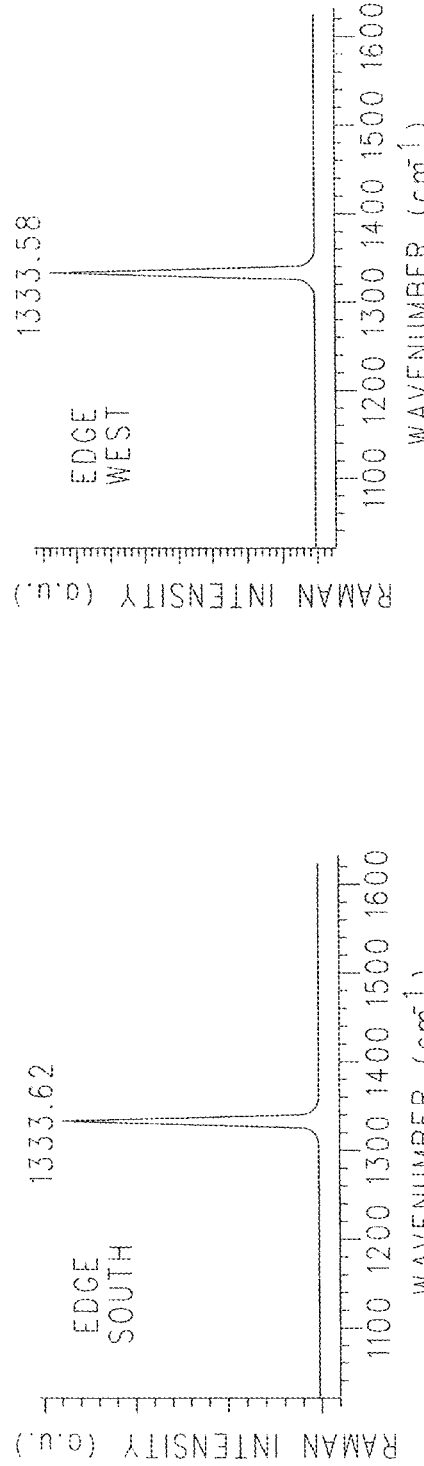

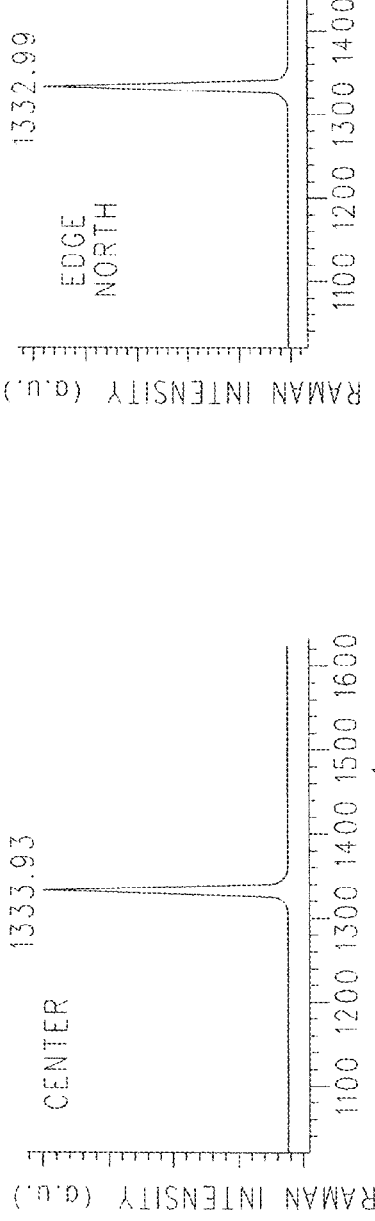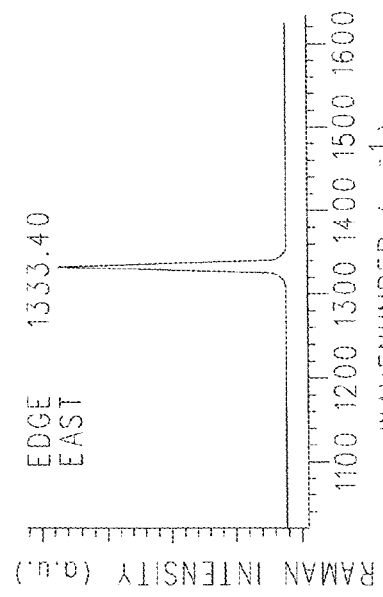

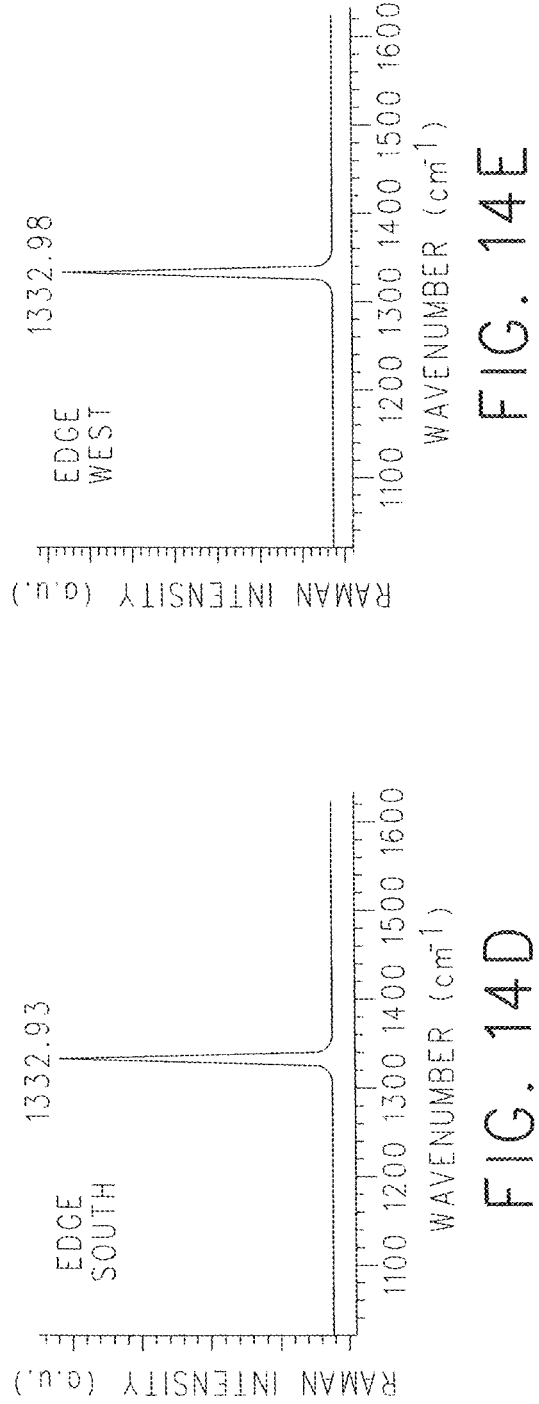

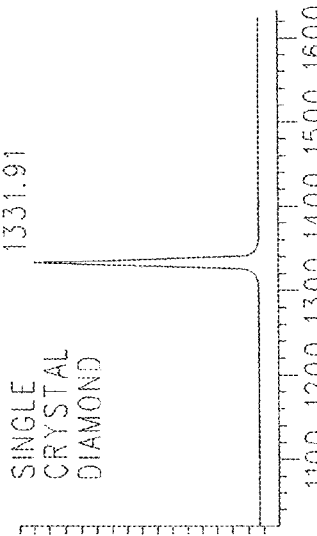

SUMMARY OF RAMAN PEAK SHIFT

| DIAMOND RAMAN PEAK POSITION (/cm) | DIAMOND RAMAN PEAK WIDTH (/cm) | DIAMOND PEAK SHIFT (/cm) | AVERAGE PEAK SHIFT (/cm) | NOTE |
|---|---|---|---|---|
| 1332.53 | 4.04 | 0 | | ZERO-STRESS REFERENCE |
| 1332.67 | 3.13 | 0.14 | +0.01 | FREE STANDING DIAMOND WINDOW, 85mm x 1.0mm, POLISHED |
| 1332.36 | 3.48 | -0.17 | | |
| 1332.53 | 3.39 | 0.00 | | |
| 1332.61 | 3.11 | 0.08 | | |
| 1335.85 | 4.98 | 3.32 | +3.33 | THIN DIAMOND FILM ON W SUBSTRATE |
| 1335.87 | 4.96 | 3.34 | | |
| 1335.85 | 3.85 | 3.32 | | |
| 1333.93 | 4.68 | 1.40 | +0.72 | * MIXTURE OF BIG (~50um) AND SMALL (~5um) GRAINS |
| 1332.99 | 6.35 | 0.46 | | |
| 1333.40 | 6.48 | 0.87 | | |
| 1332.93 | 4.42 | 0.40 | | |
| 1332.98 | 5.31 | 0.45 | | |

FIG. 16B

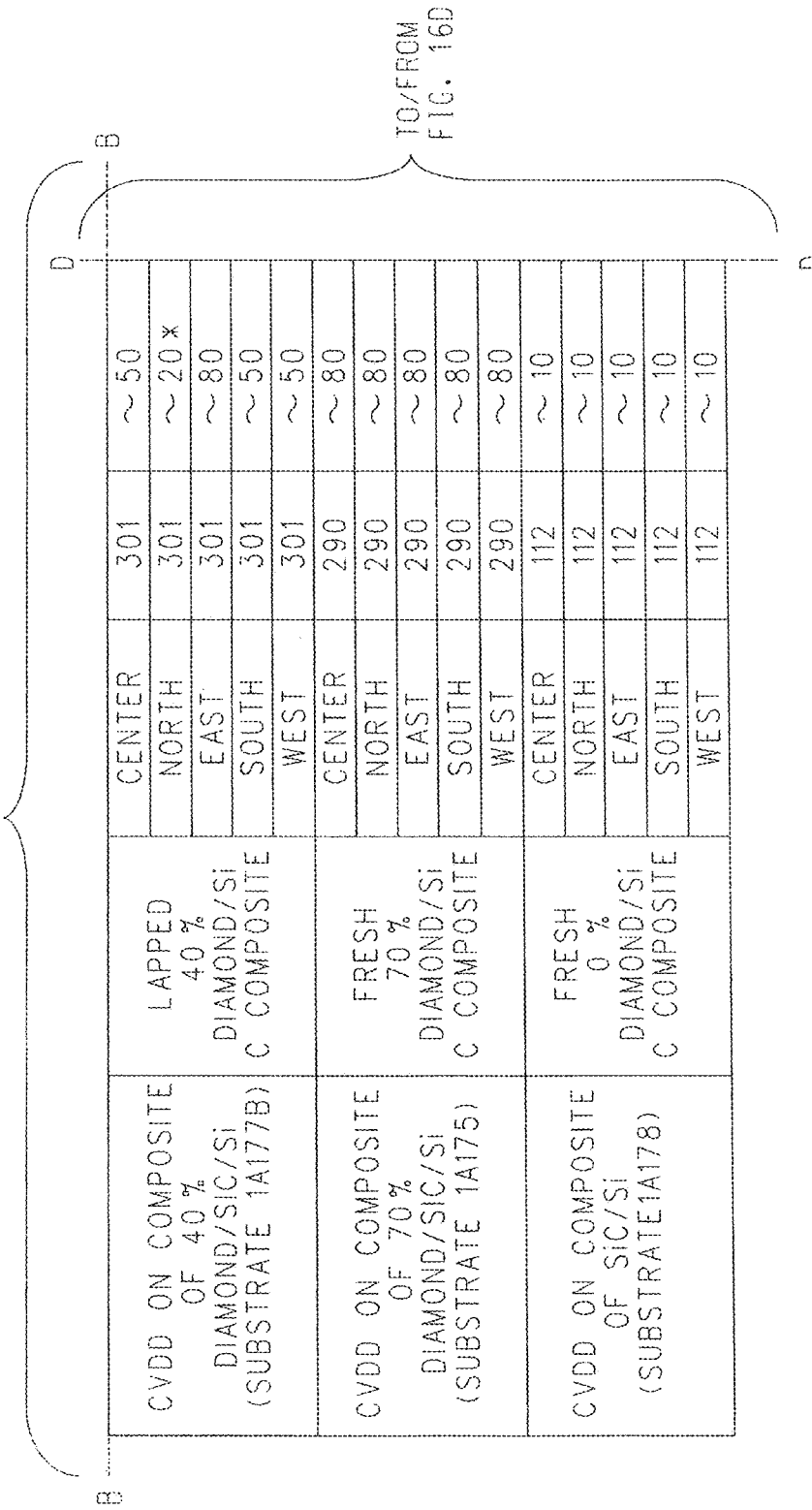

| | | | |
|---|---|---|---|
| 1333.67 | 3.20 | 1.14 | |
| 1334.35 | 5.82 | 1.82 | |
| 1333.43 | 3.42 | 0.90 | |
| 1333.62 | 3.10 | 1.09 | +1.20 | *SMALLER GRAIN SIZE THAN REST OF THE FILM |
| 1333.58 | 6.43 | 1.05 | |
| 1332.75 | 3.20 | 0.22 | |
| 1333.27 | 3.40 | 0.74 | +0.45 |
| 1333.52 | 3.82 | 0.99 | |
| 1332.45 | 3.43 | -0.08 | |
| 1332.89 | 4.29 | 0.36 | |
| 1335.03 | 4.71 | 3.12* | +2.89 | *SINGLE CRYSTAL DIAMOND RAMAN PEAK AT 1331.91/cm. |
| 1335.33 | 3.64 | 3.42* | |
| 1334.52 | 3.71 | 2.61* | |
| 1334.56 | 3.84 | 2.65* | |
| 1334.56 | 4.17 | 2.65* | |

FIG. 16D

SUBSTRATE INCLUDING A DIAMOND LAYER AND A COMPOSITE LAYER OF DIAMOND AND SILICON CARBIDE, AND, OPTIONALLY, SILICON

CROSS REFERENCE TO RELATED APPLICATION

This application claims priority from U.S. Provisional Patent Application No. 61/931,227, filed Jan. 24, 2014, which is incorporated herein by reference.

BACKGROUND OF THE INVENTION

1. Field of the Invention

The present invention is a multilayer substrate comprising a layer of diamond and a composite layer comprising particles of diamond and silicon carbide, and, optionally, particles of silicon and a method of making the multilayer substrate.

2. Description of Related Art

Diamond is the hardest material known, having a Mohs Hardness of 10, which makes diamond most useful for applications of cutting, machining, drilling, milling, etc. Diamond is also the most thermally conductive material known, having a thermal conductivity up to 2000 to 2200 watts per meter per degree Kelvin (K), which makes it highly desirable for applications in thermal management under demanding conditions. Diamond also has an extremely low coefficient of friction, which makes it a versatile material for uses such as brakes.

Diamond is also an excellent optical material for transmitting microwave, infrared, visible, and other ultraviolet electromagnetic waves. Diamond also has high stability when used as detector for high fluence nuclear radiation. In addition, diamond is also a highly inert material in chemical environments that might involve strong acids, strong bases, strong oxidizing agents, or strong reducing agents, even at elevated temperatures or at cryogenic conditions. Furthermore, diamond is one of high refractive index materials, which leads to its popular and most premium values in jewelry industries.

Information regarding diamond can be found in the following references, (1) "Properties, Growth and Applications of Diamond", Edited by M. H. Nazare and A. J. Neves, 2001, published by The Institute of Electrical Engineers; (2) "Diamond Films Handbook", edited by Jes Asmussen and D. K. Reinhard, 2002, published by Marcel Dekker; and (3) "Diamond Films, Chemical Vapor Deposition for Oriented and Heteroepitaxial Growth", Edited by Koji Kobashi, 2005, published by Elsevier.

Though diamond is one of the most versatile and most premium materials, its availability is very limited in nature. Moreover, diamond mined from the earth is typically of single crystal whose geometrical dimensions are very limited in size, most of the time, too small for industrial uses that require large dimensions. Many times, diamond formed in nature also contains impurities and crystal defects. The diamond crystal that is relatively large in crystal size, relatively pure in chemical contents, and relatively perfect without crystal defects is very expensive, often times, priceless.

Synthetic diamond is known to be produced industrially in chemical reactors under extremely high pressures and extremely high temperatures, called a high temperature and high pressure (HTHP) process. Due to harsh growth conditions, the reactor size is often limited, as are the dimensions of diamonds produced from the HTHP process, not to mention its associated high cost in process, equipment, and safety. Often times, the HTHP process produces diamond having a yellow tint due to the incorporation of catalytic impurities into the diamond lattice.

Industrially, single crystal diamond can also be grown in reactors in a process called chemical vapor deposition (CVD), where suitable growth conditions can be achieved by microwave-enhanced plasma, tungsten hot-filament, DC-Jet plasma, laser-induced plasma, acetylene-torch, etc. It is well known in art that CVD growth processes can also successfully grow polycrystalline diamond thin films on different substrates and/or free standing diamond thick films, though it is challenging to obtain low stress films or non-cracking diamond of significance in size. However, the CVD process typically produces diamond pieces that can be significantly greater than the diameter of single crystal diamond from nature or grown from the HTHP process. Nevertheless, the growth rate of diamond in CVD process, or any diamond growth process is generally slow, in a range from a growth rate of less than 1 micron/hr to a growth rate of no more than about 10 to 20 microns/hr, though some claim to be able to grow single crystal at a higher growth rate, but with many defects.

Growing a thick film of diamond on a substrate to form a composite of a layer of diamond film on a layer of the substrate is challenging due to the presence of extreme stress resulting from very different physical and chemical properties between the diamond and the substrate on which the diamond grows, such as, thermal conductivity, electrical conductivity, coefficient of thermal expansion, Young's modulus, etc. Chemically, the material of the substrate needs to be able to form carbide, a necessary bonding between atoms of chemical element of the substrate and atoms of carbon, which creates an interface that has some kind of affinity for other carbon bond containing materials to attach to, at least, by surface physical interactions such as van der Waal's forces, so that diamond crystals can seed on, which also bridges some chemical differences between diamond and the substrate. Silicon, tungsten, molybdenum, silicon carbide, tantalum, niobium, etc., are the carbide former, for which carbon from carbide provides some anchoring mechanism for diamond to stick to. This may be the reason that prior art has been able to demonstrate the some successes in depositing a diamond layer on this type of substrate under certain growth conditions. However, the interactions between diamond and the substrate may be in the physical interaction level by van der Waals' forces, or at a chemical level with some carbon-carbon bonding, at most, not even to mention that there is a crystal lattice mismatch between diamond lattices and metal carbide lattices, for which carbon-carbon bonds between diamond carbon and substrate carbon would be imperfect, creating stress defects for failures at the interface.

With respect to the physical properties, diamond and the substrate materials are also very different. For example, silicon has a thermal conductivity of 149 W/m-K, tungsten 173 W/m-K, molybdenum 138 W/m-K, tantalum 57.5 W/m-K, and niobium 53.7 W/m-K, etc., while diamond has a thermal conductivity of 2000 to 2200 W/m-K. Silicon has a coefficient of thermal expansion of $2.7 \times 10^{-6}$/m/m-K, tungsten $4.6 \times 10^{-6}$/m/m-K, molybdenum $4.8 \times 10^{-6}$/m/m-K, tantalum $3.6 \times 10^{-6}$/m/m-K, niobium $4.0 \times 10^{-6}$/m/m-K, etc., while diamond only has a coefficient of thermal expansion of $1.0 \times 10^{-6}$/m/m-K. Silicon has an electrical resistivity of 103 Ω-m, tungsten $52.8 \times 10^{-9}$ Ω-m, molybdenum $53.4 \times 10^{-9}$ Ω-m, tantalum $131 \times 10^{-9}$ Ω-m, niobium $152 \times 10^{-9}$ Ω-m, etc., while diamond has an electrical resistivity of $10^{11}$ Ω-m. Herein, when used as to represent a unit for a numerical value, "m"=meter and "K"=degree Kelvin.

The extreme differences in physical properties between diamond and such substrate materials create challenges to grow a thick diamond film or layer on these substrate materials without delamination, in addition to the intrinsic limitations resulting from chemical bonding of diamond and substrates, if there were any. It is envisioned that a diamond film CVD grown on these substrates is probably highly stressed prior to delamination from the substrate, which happens during deposition sometimes, and which happens after shutting down the reactions, sometimes. Even if a diamond film survives without delamination, this diamond film, most of times, a thin film, is still highly stressed, which is highly undesirable for various applications, since the film might delaminate while standing alone, or delaminate while being used for different purposes.

Prior art takes advantages of delamination behaviors of a diamond film on a substrate to separate the diamond film from a substrate and produce a free-standing diamond film, though difficult. The delamination process may involve vast amounts of stress. To this end, it is difficult to obtain a crack-free diamond thick film as a thick diamond film might shatter into many small pieces. When the diameter, or geometrical dimension, of a diamond film or layer increases, the problem of preserving the geometry without cracking, thick or thin, become even more challenging, or impossible. Sometimes a diamond film partially delaminates and leaves some substrate areas with some undelaminated diamond, which prevents reuse of this substrate in the next diamond film growth. Since diamond is the hardest material on earth, grinding off residual diamond film from a substrate is difficult, time-consuming and expensive. Even when surviving the delamination, a diamond thin film, even with small dimensions, is very fragile and difficult to handle, which makes it impossible to use a free-standing thin film of diamond for industrially practical applications.

In many practical applications, a unique and intact composite of a diamond layer on a substrate layer, having a minimum or reduced stress between the diamond layer and the substrate layer, without cracking or shuttering or without risk of being cracked or shattered while standing or while in use, is highly desirable. Sometimes, a thin diamond layer is desirable when supported on an inexpensive substrate, with minimum or reduced stress enabling its successful use in harsh conditions, found in machining, drilling, cutting, milling, etc. Sometimes, a composite of a thick diamond layer on a substrate layer of large geometric dimensions, having a minimum stress or reduced stress, crack-free or having a minimum level of crack, is desirable for applications like optical mirrors, thermal management, friction control, mechanical uses like drilling, machining, cutting, milling, etc.

SUMMARY OF THE INVENTION

Disclosed herein is a multilayer substrate comprising a diamond layer and a composite layer comprised of particles of diamond and silicon carbide, and, optionally, silicon. The multilayer substrate has a diamond layer of low stress or minimum stress, demonstrated in Raman spectroscopy, and the diamond layer may be either thin or thick, dictated by the requirements of applications and by the diamond growth method. The diamond layer may bond to the composite layer by $sp^3$ carbon-carbon bonding, at the diamond lattice level, to exposed diamond particles on the surface of the composite comprising diamond and silicon carbide, and, optionally, silicon and strongly anchored onto the composite layer, beyond possible physical interactions (such van der Waal's forces), and or possible chemical interactions, if there were any, of carbon-carbon bonding of diamond seed crystals to the substrate metal carbide (having substantial crystal lattice mismatch between diamond lattice and metal carbide lattice, at the interface between silicon carbide and diamond crystal seeds). In addition, physical properties of the diamond layer and the composite layer give additional advantages, for example, Young's modulus, thermal conductivity, and coefficient of thermal expansion. These advantages, possibly resulting from the chemical anchoring mechanism and physical property resemblances between the diamond layer and the composite layer, may allow the multilayer substrate to be used in applications such as, but not limited to, mechanical (drilling, cutting, machining, or milling, etc.), thermal management (electronics, lasers, optics, semiconductors, or light emitting devices, etc.), detector (high energy radiation particles, UV light, and probes, etc.), optics (mirror or lens, etc.), friction control (braking system), electromagnetic wave and sound wave management (sound conductance, etc.), chemical inertness, wear control (such as pump seal or underground drill seal) or an area where temperature fluctuation may be relatively high and a premium of stress control is critical. The scope of the present invention, however, is not to be limited by the explanation offered in the present disclosure.

Also disclosed is a method of making the multilayer substrate comprising a diamond layer and a composite layer comprised of particles of diamond and carbon carbide, and, possibly, silicon. The method includes making a composite layer comprised of particles of diamond and silicon carbide, and, optionally, silicon. During this process, a composite or its preform may be mechanically machined, lapped, polished, cut, drilled, or any other method. Next, a diamond layer, thin or thick, is formed or deposited on the composite layer via, but not limited to, chemical vapor deposition.

The chemical vapor deposition of the diamond layer may include, but is not limited to, microwave plasma chemical vapor deposition, hot filament chemical vapor deposition, direct current jet/thermal plasma chemical vapor deposition, combustion spray plasma chemical vapor deposition, laser-aided chemical vapor deposition, etc.

The multilayer substrate may be further processed (such as cutting, milling, machining, drilling, lapping, bonding, brazing, or polishing, coating, etc.) for applications such as mechanical (drilling, cutting, machining, or milling, etc.), thermal management (electronics, lasers, optics, semiconductors, or light emitting devices, etc.), detector (high energy radiation particles, UV light, and probes, etc.), optics (mirror or lens, etc.), friction control (braking system), electromagnetic wave and sound wave management (sound conductance, etc.), chemical inertness, wear control (such as pump seal or underground drill seal) or an area where temperature fluctuation may be relatively high and a premium of stress control is critical, or a large geometrical dimension may be needed, or a fast heat removal or delivery is needed, or a wear-resistance or abrasion-resistance is needed, or diamond's superior properties is needed but a solid piece diamond is too expensive, etc.

Various preferred and non-limiting embodiments or aspects of the present invention will now be described and set forth in the following numbered clauses:

Clause 1: A multilayer substrate comprising a composite layer comprised of diamond particles and silicon carbide particles; and a chemical vapor deposition (CVD) grown diamond layer on the composite layer, wherein diamond of the diamond layer CVD grows on crystal surfaces of the diamond particles and/or the silicon carbide particles comprising the composite layer.

Clause 2: The multilayer substrate of clause 1, wherein the diamond layer comprises polycrystalline diamond.

Clause 3: The multilayer substrate of clauses 1 or 2, wherein the composite layer is further comprised of silicon particles.

Clause 4: The multilayer substrate of any of clauses 1-3, wherein the diamond layer is one of the following: undoped; doped with an n-type element or compound; doped with a p-type element or compound; or doped with boron.

Clause 5: The multilayer substrate of any of clauses 1-4, wherein the diamond layer is patterned or selectively etched.

Clause 6: The multilayer substrate of any of clauses 1-5, wherein the diamond particles in the composite layer have a concentration gradient in the composite layer between 0% and 100%.

Clause 7: The multilayer substrate of any of clauses 1-6, wherein a loading level (by volume) of diamond particles in the composite layer is one of the following: ≥5%; ≥20%; ≥40%; or ≥60%.

Clause 8: The multilayer substrate of any of clauses 1-7, wherein a thickness of the diamond layer is one of the following: between $10^{-9}$ meters and $10^{-6}$ meters; between $5 \times 10^{-6}$ meters and $20 \times 10^{-3}$ meters; between $500 \times 10^{-6}$ meters and $10 \times 10^{-3}$ meters; between $1 \times 10^{-6}$ meters and $5 \times 10^{-3}$ meters; between $3 \times 10^{-6}$ meters and $3 \times 10^{-3}$ meters; between $50 \times 10^{-6}$ meters and $50 \times 10^{-2}$ meters; between $100 \times 10^{-6}$ meters and $10 \times 10$ meters; between $200 \times 10^{-6}$ meters and $5 \times 10^{-2}$ meters; or between $500 \times 10^{-6}$ meters and $2 \times 10^{-2}$ meters.

Clause 9: The multilayer substrate of any of clauses 1-8, wherein a thickness of the multilayer substrate is one of the following: $\geq 200 \times 10^{-6}$ meters; $\geq 20 \times 10^{-3}$ meters; $\geq 40 \times 10^{-3}$ meters; $\geq 75 \times 10^{-3}$ meters; $\geq 50 \times 10^{-6}$ meters; $\geq 500 \times 10^{-6}$ meters; or $\geq 1 \times 10^{-3}$ meters.

Clause 10: The multilayer substrate of any of clauses 1-9, wherein the multilayer substrate has one of the following shapes or a combination of two or more of the following shapes: circle, square, rectangle, polygon, ellipse, curve, sphere, aspheric, cylinder, cone, concave, or convex.

Clause 11: The multilayer substrate of any of clauses 1-10, wherein a surface of the diamond layer is grown or polished to desired roughness and flatness values.

Clause 12: The multilayer substrate of any of clauses 1-11, configured for use as one of the following: an optical device; a detector for detecting high energy radiation particles; a detector for detecting electromagnetic waves; a device for cutting, drilling, machining, milling, lapping, polishing, coating, bonding, or brazing; a braking device; a seal; a heat conductor; an electromagnetic wave conducting device; a chemically inert device configured for use in a highly corrosive environment, a strong oxidizing environment, or a strong reducing environment, at an elevated temperature, or under a cryogenic condition; or a device for polishing or planarization of semiconductor device, wafer or film, pad, an optical device, wafer or film, and or an electronic device, wafer or film.

Clause 13: The multilayer substrate of any of clauses 1-12, wherein the optical device is either a planar optic or a non-planar optic.

Clause 14: The multilayer substrate of any of clauses 1-13, wherein the planar optic is a mirror or a lens.

Clause 15: The multilayer substrate of any of clauses 1-14, wherein the non-planar optic is spherical, or aspheric, or a cone, or a cylinder.

Clause 16: The multilayer substrate of any of clauses 1-15, wherein the optical device includes an optical coating for management of electromagnetic waves.

Clause 17: A method of forming the multilayer substrate of any of clauses 1-16 comprising: (a) forming a composite layer comprised of diamond and silicon carbide; (b) positioning the composite layer on a substrate holder of a reactor; and (c) growing a diamond layer on the composite layer positioned on the substrate holder in the reactor, wherein diamond of the diamond layer grows directly on crystal surfaces of the diamond particles comprising the composite layer.

Clause 18: The method of any of clauses 1-17, wherein the composite layer further includes silicon.

Clause 19: The method of any of clauses 1-18, wherein step (c) includes growing the diamond layer on the composite layer via chemical vapor deposition.

Clause 20: The method of any of clauses 1-19, wherein step (a) further includes machining, lapping polishing, cutting, or drilling the composite layer.

BRIEF DESCRIPTION OF THE DRAWINGS

FIG. 2 is a diagram showing various steps that can be used to make the multilayer substrate of FIG. 1;

FIGS. 7A-7E are Raman spectra at five different locations of the CVD diamond layer shown in FIG. 6;

FIGS. 11A-11C are Raman spectra at three different locations of the CVD diamond layer shown in FIG. 10;

FIGS. 13A-13E are Raman spectra obtained at five different locations of the CVD diamond layer shown in FIG. 12;

FIGS. 14A-14E are Raman spectra obtained at five different locations of a CVD grown diamond layer that was deposited on the opposite side of the composite substrate upon which the CVD diamond layer shown in FIG. 12 was deposited;

FIGS. 15A-15E are Raman spectra at five different locations of a CVD grown diamond layer grown on a composite layer containing 0% diamond;

FIG. 15F is a reference Raman spectra of a natural single crystal diamond.

DETAILED DESCRIPTION OF THE INVENTION

Figure 1:
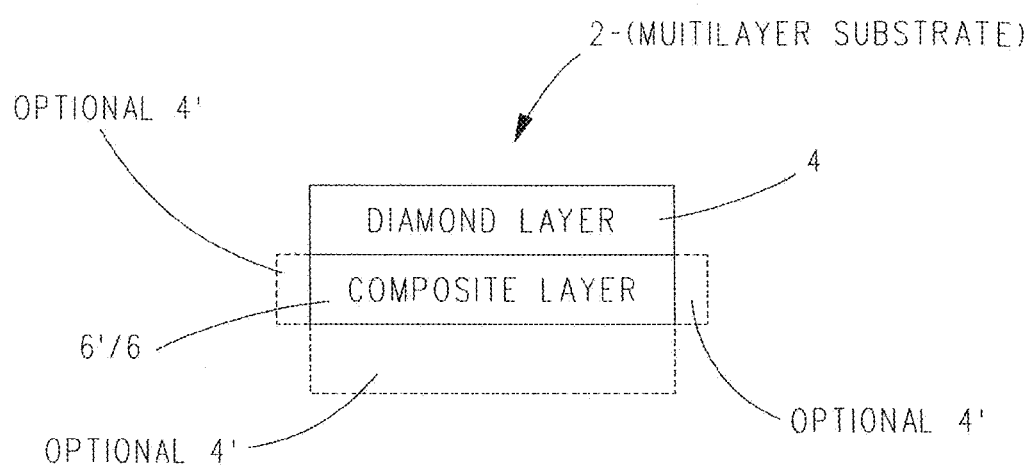
FIG. 1 is an exemplary multilayer substrate comprised of a layer of diamond and a layer of composite comprised of diamond and silicon carbide, and, optionally, silicon.

With reference to FIG. 1, disclosed herein is a multilayer substrate 2 comprised of at least a layer of diamond 4 and a layer of composite 6 comprised of diamond and silicon carbide, and, optionally, silicon.

Diamond layer 4 comprises polycrystalline (including nanocrystalline, microcrystalline, large crystalline, and/or mono crystalline) diamond, regardless of how it is made. Composite layer 6 comprises particles of diamond and silicon carbide, and, optionally, silicon, regardless how composite layer 6 is made.

Surprisingly, diamond layer 4, thin or thick, was able to be grown or deposited on composite layer 6 without suffering delamination, cracking, or shattering after diamond deposition. More surprisingly, the diamond layer 4 grown or deposited on the composite layer 6 had a lower stress, demonstrated by Raman peak shift, which might explain the uniqueness of multilayer substrate 2. However, the scope of the present invention is not to be construed as limited by the explanation herein.

The diamond particles in composite layer 6 may be exposed, or partially exposed, at the surface of composite layer 6. Therefore, diamond layer 4 formed during, e.g., CVD deposition, of diamond on composite layer 6 grows on the crystal surfaces of the diamond particulates and/or the silicon carbide particles that are part of composite layer 6, which leads to a seamless and intrinsic C—C sp$^3$ chemical bonding of the diamond lattice. Therefore, the bonding between the newly-grown diamond layer 4 and the diamond particulate in composite layer 6 is intrinsically strong and well anchored, unlike the prior art that seeded diamond crystals onto a substrate surface that included metal carbide.

It is envisioned that diamond particles at the surface of composite layer 6 may not have their diamond crystal lattice exposed for CVD growth of diamond layer 4. More specifically, during the making of composite layer 6, it is envisioned that silicon may react with the diamond particles of composite layer 6, forming an interface layer of silicon carbide on, for example, without limitation, exposed surfaces of the diamond particles of composite layer 6. If composite layer 6 is processed, e.g., lapped or polished, prior to CVD deposition of diamond layer 4 on composite layer 6, it is envisioned that a silicon carbide interface layer will not be present on the exposed diamond crystal surfaces of the diamond particles of composite layer 6, and that diamond layer 4 can grow directly on these exposed diamond crystal surfaces and on the silicon carbide particles forming composite layer 6. On the other hand, if diamond layer 4 is deposited on unprocessed composite layer 6, e.g., on the diamond crystal surfaces of the diamond particles of composite layer 6 that include an interface layer of silicon carbide, it is envisioned that diamond layer 4 will grow on this interface layer of silicon carbide and on the silicon carbide particles forming composite layer 6. The prior art substrate surface including metal carbide might have a certain level of affinity to diamond carbon atoms through physical interactions, such as van der Waals forces, providing for adhesion of newly-nucleated diamond particles on the substrate surface, or at most, having a monolayer bonding of Carbon-Carbon bond, one carbon atom from the substrate surface of metal carbide and one carbon atom from the newly seeded diamond particle, though bonding would be expected to be highly defective due to the mismatch of diamond crystal lattices and substrate metal carbide crystal lattices. Therefore, adding any amount of diamond particulates into a composite system that forms the composite layer 6 comprised of diamond and silicon carbide, and, optionally, silicon is beneficial.

Composite layer 6 included diamond loading (by volume) desirably ≥5%, more desirably ≥10%, still more desirably ≥20%, even more desirably ≥30%, highly desirably ≥40%, further desirably ≥50% or above, and most desirably ≥60%.

Composite layer 6 of multilayer substrate 2 may have a gradient of diamond concentration along certain geometrical dimension(s), from as low as 0% diamond to as high as 100% diamond.

Diamond layer 4 may be un-doped, p-doped, or n-doped. Diamond layer 4 may also be patterned, or selectively etched, etc., for different applications.

The size of the diamond particle comprising composite layer 6 may range from a few nanometers to a few hundred microns or larger. Such diamond particles may be doped by other chemical elements, for example, boron, for achieving other properties like electrical conductivity for some unique applications.

The silicon carbide particles comprising composite layer 6 may range in size from a few nanometers to a few hundred or thousand microns or larger. Such silicon carbide particles may contain other chemical impurities, sometimes for economic reasons.

Optional silicon in composite layer 6 may range in size from a few nanometers to a few hundred microns or larger. The silicon particles may be crystalline or amorphous. The silicon may be semiconductor grade in purity, or may be industrial grade in purity.

Multilayer substrate 2 may be any thickness, any diameter round, any dimension of squares, any dimensions of rectangles, or any size with any geometrical shapes, or irregular shape in geometry. The size, dimension, and shape may be dictated by the applications, or by CVD method used to grow or deposit diamond layer 4 on composite layer 6.

Diamond layer 4 may be any thickness. For thin film or coating applications, the thickness may be as thin as a few nanometers to a few microns. Such thin coatings can be diamond or diamond-like carbon in nature for optical transparency, reflectivity, smoothness, or flatness. For thick film applications, the thickness might be a few microns to a few millimeters or thicker. Desirably, the thickness of diamond layer 4 ranges from between a few nanometer and 5 millimeters, more desirably between 20 microns and 4 millimeters, still more desirably between 50 microns and 3 millimeters, and most desirably between 100 microns and 3 millimeters. Desired optical surface finishing parameters, such as surface roughness and flatness, may be achieved for either as-grown diamond layer 4 or as-grown diamond layer 4 followed by applying different surface finishing techniques such as regular polishing process or e-beam polishing process, which is applicable for either a thin film diamond or a thick film diamond.

Composite layer 6 may be any thickness. For example, composite layer 6 may be on the order of a few microns, a few millimeters, a few centimeters, or more in thickness depending on the application.

The diameter or largest lateral dimension of multilayer substrate 2 may be a few millimeters, a few decades of millimeters, a few hundred millimeters, or even greater, depending on the application and the method and reactor dimensions used for chemical vapor deposition of the diamond layer 4 on composite layer 6.

Given its mechanical hardness, diamond layer 4 is highly desirable for products used in mechanical applications because diamond layer 4 will have long life and durability, given a certain thickness, and a lower chance of failure that may be caused by the stress of diamond layer 4. Examples of mechanical applications include, without limitation, drilling, cutting, milling, machining, etc. For less harsh environments, only a thin diamond layer 4 may be needed. For harsher working conditions, a thicker diamond layer 4 can be grown on composite layer 6, which can extend the life of multilayer substrate 2 and allow it to perform more consistently in those more demanding conditions.

The thermal conductivity of diamond layer 4 grown by CVD on composite layer 6 may allow diamond layer 4 to be used in thermal management applications, such as, without limitation optical applications, electronic application (heat spreaders), aerospace applications, chemical applications, etc., heretofore not known in the art.

In addition to the thermal conductivity of diamond layer 4, composite layer 6 has a thermal conductivity of as high as 625 W/m-K, or higher (much better than copper's thermal conductivity 401 W/m-K), when the diamond loading in composite layer 6 is at 70%. At 42% level of diamond loading in composite layer 6, the composite layer 6 has a thermal conductivity of 450 W/m-K, still higher than copper's thermal conductivity (401 W/m-K). The thermal conductivity of composite layer 6 is improved from a thermal conductivity of a prior art product (M-Cubed Technology's SSC-702) silicon carbide and silicon composite 170 W/m-K toward diamond's thermal conductivity, namely, 2000 to 2200 W/m-K, as the diamond loading of composite layer 6 increases.

The thermal conductivity of composite layer 6 would be 981 W/m-K for 42% diamond loading and 1,521 W/m-K for 70% diamond loading, if one calculates thermal conductivity with a linear model, so the results of thermal conductivity properties of such composite layers are unexpected. The unique combination of diamond layer 4 and composite layer 6 of multilayer substrate 2 allows diamond layer 4 to conduct heat energy from a concentrated, hot and/or heat-generating area laterally or horizontally along diamond layer 4, and dissipate said energy vertically into the mass of composite layer 6 which may be thicker, cheaper, and easier to make, as compared to using a layer of pure diamond. This may be particularly favorable for uses in laser optics, electronics, aerospace, or wherever fast heat removal is desired. Alternatively it may be used in applications that require a quick delivery of heat energy.

Diamond layer 4 may be optionally lapped and polished to an optical finish, and/or optionally coated with one or more optical coatings for control of electromagnetic waves, such as microwaves, infrared light, and visible light, or other types of coatings for different purposes for which lapping, polishing, and coating processes are well known in the art. Optics made using multilayer substrate 2 may have a planar surface, or may have a non-planar surface, such as, but not limited to, a sphere, a cone, a cylinder, or any surface that has been used in an optical application in the prior art. Diamond layer 4 of multilayer substrate 2 may be polished by post processing or may by grown into a range of roughness and flatness values that meet the needs of practical applications. Other type of coatings may be applied to a surface of multilayer substrate 2, either a surface of diamond layer 4 or a surface of composite layer 6.

The dimensional stability of both diamond layer 4 and composite layer 6 gives unexpected advantages for uses in an environment that demands properties that diamond layer 4 has and, at the same time, experiences significant temperature fluctuations. The coefficient of thermal expansion of composite layer 6 is unexpectedly reduced from $2.9 \times 10^{-6}$/m/m-K for a standard product of the composite (M-Cubed SSC-702) comprising no diamond particles to $1.5 \times 10^{-6}$/m/m-K for composite layer 6 comprising 42% diamond particles (by linear model calculations, its coefficient of thermal expansion should have decreased just to $2.1 \times 10^{-6}$/m/m-K) and further down to as low as $1.2 \times 10^{-6}$/m/m-K for composite layer 6 comprising 70% diamond particles (by linear model calculations, the coefficient of thermal expansion should have decreased just to $1.6 \times 10^{-6}$/m/m-K), which is an almost diamond-like material (diamond coefficient of thermal expansion is $1.0 \times 10^{-6}$/m/m-K). This is highly desirable in the applications, like a brake system which involves friction, that requires superior abrasion resistance of diamond, and at the same time, involves a generation of vast amounts of heat and, subsequently, quick heat removal without experiencing an extreme rise in temperature, and may require premium dimension stability of multilayer substrate 2. However, the scope of the present invention is not to be construed as limited to these applications.

Diamond is known to be a superior detector for high energy particle radiation. The unique composition of multilayer substrate 2 is cheaper and easier to make and there are no dimension limitations in multilayer substrate 2 due to cracking or shattering. All of these desirable characteristics make multilayer substrate 2 feasible and economical for use as a detector for high energy radiation, sound conducting mechanisms, and many other applications.

Due to the chemical inertness of diamond, the unique composition of multilayer substrate 2 may be used in demanding applications involving chemically harsh and corrosive environments, even at elevated temperatures.

Also or alternatively, as shown in phantom in FIG. 1, one or more additional diamond layers 4' may be applied to the side, or sides, and/or the bottom surface of composite layer 6 as long as the reactor of chemical vapor deposition (CVD) for the growth of diamond layer 4' allows. It is envisioned that diamond layer 4' may be bonded or grown on one or more surfaces of composite layer 6 by any possible means.

Due to the unique quality of diamond, the surface of diamond layer 4 may be patterned or selectively etched, etc. for different applications.

Due to the unique anchoring mechanism of diamond layer 4 onto composite layer 6, multilayer substrate 2 may be used as a polishing or planarization conditioner for chemical mechanical planarization or polishing of semiconductor devices wafers or films, optical devices wafers or films, and/or electronic devices, wafers or films.

A Process of Making a Multilayer Substrate 2 Comprising a Layer of Diamond 4 and a Layer of Composite 6.

With reference to FIG. 2 and with continuing reference to FIG. 1, FIG. 2 is a diagram of various steps that can be used to make multilayer substrate 2 comprising at least a layer of diamond 4 and a layer of composite 6 comprising diamond and silicon carbide, and, optionally, silicon. A more detailed process is disclosed hereinafter.

The first step is the preparation of composite layer 6 comprising diamond and silicon carbide, and, optionally, silicon. Diamond particles are mixed with silicon carbide (SiC) particles or a silicon carbide (SiC) forming precursor, optional silicon particles, and, optionally carbon in form of graphite, carbon black, and/or carbon-forming precursor. The mixture is then used to form a solid article by casting, pressing, or isostatic pressing. The solid article is optionally heated to temperatures sufficient to form carbonaceous species.

Then, the article is optionally hot pressed for sintering, or optionally sintered under high pressure and at high temperatures or sintered at high temperatures under normal or atmospheric pressure, or infiltrated with silicon at high temperatures under a pressure higher than normal or atmospheric pressure, a normal or atmospheric pressure, or a vacuum. During the sintering, hot pressing, or infiltration process, diamond particles may partially react with silicon to form silicon carbide and added non-diamond carbon, such as graphite, carbon black, carbon fiber and/or carbonaceous species formed at intermediate temperatures may also react with silicon to form silicon carbide. The non-diamond carbon source(s) may not completely react with silicon and silicon may not completely react with diamond and carbon source(s). The resulting composite layer 6 may comprise diamond and silicon carbide; may comprise diamond, silicon carbide, and silicon; may comprise diamond, silicon carbide, and carbon; or may comprise diamond, silicon carbide, silicon, and non-diamond carbon. The composite can be mechanically machined, or processed by any methods, into any shape or dimension during this process or at the end of the process.

The composite layer 6 prepared by first step may be optionally lapped, polished, cut, or processed by any methods prior to the second step (described next), namely, depositing or bonding a layer of diamond 4 onto the prepared composite layer 6. As a second step, diamond layer 4 may be bonded onto the prepared composite layer 6 to form multilayer substrate 2. The diamond layer 4 may be deposited onto a surface of composite layer 6 by a chemical vapor deposition (CVD) method such as, but not limited to, microwave plasma, hot filament, direct current plasma, combustion flame, radio frequency and or very high frequency plasma, lasers, etc., detailed in the following section, to form multilayer substrate 2.

Diamond layer 4 may be bonded or deposited onto one or both sides, or all sides of composite layer 6 to form multilayer substrate 2.

As a third step, the prepared multilayer substrate 2 may then optionally be further processed by different processes including, but not limited to, cutting, drilling, machining, lapping, polishing, coating, bonding, brazing, etc. for different applications, including, but limiting to, mechanical (such as, but not limited to, cutting, drilling, machining, or milling, etc.), optical (such as, but not limited to, mirror, lens, etc.), thermal management (such as, but not limited to, electronics, semiconductors, lasers, quick heat removal or quick heat delivery, or at elevated temperatures or under cryogenic conditions), chemical inertness (corrosive environment such as, but not limited to, strong acid, strong base, strong oxidizing environment, strong reducing environment, at elevated temperatures, or under cryogenic conditions), friction control (such as, but not limited to, a brake system demanding proper friction and fast heat control), electromagnetic or sound wave management (such as, but not limited to, sound wave conductance), wear component (such as, but not limited to, pump seal, underground dill seal, etc.), detector (such as, but not limited to, high energy radioactive particle, UV light, electrode, etc.), or any other applications that can use multilayer substrate 2.

Method of Making a Composite Comprising Diamond and Silicon Carbide, and Optionally, Silicon for Uses in the Present Invention.

Composite layer 2 may be made in the manner disclosed in U.S. Pat. No. 8,474,362 (incorporated herein by reference) wherein (1) silicon carbide particles and diamond particles are weighed at predetermined amounts into a container, (2) phenolic resin is then added to the container and the mixture is mixed, (3) the resulting mixture is then pressed or cast into a preform in a die, (4) then the pressed or cast preform is placed into a furnace and carbonized in an inert environment, and (5) the carbonized preform is then infiltrated with silicon metal under vacuum at an elevated temperature for a desired period of time. The preform recovered from the furnace is composite layer 6.

Alternatively, composite layer 6 may be made in the manner disclosed in U.S. Pat. Nos. 4,171,339 and/or 4,353,963 (both incorporated herein by reference), wherein a diamond and silicon carbide composite is made by hot pressing an isostatic-pressed mixture of diamond, silicon, and silicon carbide substrate or silicon-silicon-carbide substrate. Alternatively, composite layer 6 may be made in the manner disclosed in U.S. Pat. Nos. 4,417,906, 4,428,755, and 4,453,951 (all of which are incorporated herein by reference), wherein a diamond-silicon carbide composite is made by mixing diamond and carbon black in paraffin to form a first dispersion and mixing carbon fiber and carbon black in paraffin to form second dispersion, followed by compacting these two dispersions together and forming a bilayer composite, then followed by paraffin removal under vacuum, and followed by silicon infiltration at an elevated temperature.

Still further, composite layer 6 may be made in the manner disclosed in U.S. Pat. No. 4,643,741 (which is incorporated herein by reference), wherein a composite of diamond and silicon carbide is formed by subjecting a mixture of caustic soda-cleaned diamond particles and silicon to high temperature and high pressure treatments.

Alternatively, composite layer 6 may be made in the manner disclosed in U.S. Pat. No. 5,010,043 (which is incorporated herein by reference), which is similar to that disclosed in U.S. Pat. No. 4,643,741, except by-passing the step of using caustic soda to clean diamond particles.

Still further, composite layer 6 may be made in the manner disclosed in U.S. Pat. Nos. 6,939,506 and 7,060,641 (both of which are incorporated herein by reference), wherein a composite layer of diamond and silicon carbide is made by sintering/infiltration of a ball-milled mixture of microcrystalline diamond particles and amorphous silicon powder and some of amorphous silicon is partially converted into nanocrystalline silicon at 600° C. and converted into nanocrystalline silicon carbide at higher temperatures.

Alternatively, composite layer 6 may be made in the manner disclosed in U.S. Pat. No. 7,959,841, a method for making a composite of diamond and silicon carbides, or in U.S. Pat. No. 8,168,115, a method of fabricating a superabrasive compact of a composite of diamond and silicon carbide (both of which are incorporated hereby reference).

Alternatively, composite layer 6 may be made in the manner disclosed in US 2011/0283629 (which is incorporated herein by reference), wherein a high strength diamond-silicon carbide compact having less than about 2% unreacted silicon and about 1% graphite is made by blending a mixture of diamond of different particle sizes and silicon of different particle size followed by hot pressing this mixture.

Method of Depositing a Diamond Layer on a Composite Layer Comprising Diamond and Silicon Carbide, and Optionally, Silicon for Making an Inventive Multilayer Substrate.

Diamond layer 4 on composite layer 6 may be deposited by chemical vapor deposition in the manner disclosed in any one of U.S. Pat. Nos. 5,250,149, 5,628,824, or 5,523,160 (all of which are incorporated herein by reference), wherein under conditions of microwave plasma, methane and hydrogen are used as a reaction gas, under vacuum, at an elevated temperature, and with a controlled microwave power.

Diamond layer 4 may be deposited on composite layer 6 in the manner disclosed in U.S. Pat. No. 5,015,494 (which is incorporated herein by reference) wherein a microwave plasma reactor operating at 2.45 GHz is used to deposit diamond film onto a substrate by using acetylene, ethylene, methanol, ethanol, or methane as carbon source along with hydrogen. This patent further discloses that nitrogen and boron-containing chemical may also be introduced into the reaction system along with the gas containing carbon and hydrogen.

U.S. Pat. No. 4,958,590 (which is incorporated herein by reference) teaches diamond deposition onto a substrate in the reactor of 2.45 GHz microwave plasma by using a gas mixture of hydrogen, methane, and carbon dioxide with a growth rate of about 6 microns/hr. U.S. Pat. No. 5,660,894 (which is incorporated herein by reference) discloses a method of using microwave plasma to deposit diamond onto a silicon substrate with a reaction gas mixture of acetylene and carbon dioxide. U.S. Pat. No. 5,749,966 (which is incorporated herein by reference) discloses the use of microwave plasma to deposit polycrystalline, nanocrystalline diamond, and diamond like carbon by controlling the reaction gas composition, a mixture of hydrogen, methane, oxygen, and argon at different growth temperatures ranging from 250° C. to 950° C. with an option of bias. U.S. Pat. No. 6,110,541 (which is incorporated herein by reference) discloses using microwave plasma to deposit diamond film onto a silicon substrate from a gas mixture containing methane with an option of applying a negative bias during the stage of nucleation. U.S. Pat. Nos. 7,115,241, 7,452,420, 7,713,507, 7,754,180, and US 2010/0116197 (all of which are incorporated herein by reference) disclose using microwave plasma to grow single crystal diamond by chemical vapor deposition from a gas mixture of nitrogen and methane in which nitrogen concentration ranges from 0.5% to about 5%.

U.S. Pat. No. 5,270,114 (which is incorporated herein by reference) discloses depositing a layer of diamond, about 350 micron in thickness, on to a silicon single crystal after its surface is scratched with diamond powders, by microwave plasma chemical vapor deposition (CVD) in a two stage process from a gas mixture of hydrogen and methane. Then the diamond film is delaminated by chemical etching. This patent also discloses using CVD to consolidate and infiltrate a porous, or irregular, surface of a substrate that includes particles of diamond, silicon nitride, tungsten, tungsten carbide, molybdenum, and silicon. More specifically, the substrate is prepared by chemical removal of metal from polycrystalline diamond compact which is Produced by (1) Metal-Coated Diamond Particles and (2) Pressing these Metal-Coated diamond particles together under higher high pressure and high temperature conditions, in which metal coating melts and allows the underlying diamond grains to grow partially together. The substrate after metal removal by acid etching includes a porous diamond substrate into which the CVD diamond deposits, infiltrating the pores and consolidating this porous diamond substrate into a solid diamond piece so that the physical properties of the porous diamond substrate improves. U.S. Pat. No. 6,344,149 (which is incorporated herein by reference) discloses a similar process in using CVD diamond to infiltrate the porous surface that is generated by removing the catalyst from the diamond-metal composite.

For making multilayer substrate 2, diamond layer 4 may be deposited on composite layer 6 by chemical vapor deposition using a hot filament reactor, as disclosed in U.S. Pat. Nos. 5,479,874, 5,445,106, 5,437,891, 5,437,728, 5,424,096, 5,391,229, 5,286,524, 4,970,986, and/or 5,523,121 (all of which are incorporated herein by reference). In this process, a gas mixture of hydrogen and a hydrocarbon, such as methane, sometimes along with some nitrogen addition, is used as feedstock and is heated to an appropriate dissociation temperature (controlled by hot filament) at which hydrogen molecule(s) are converted into hydrogen radicals and original hydrocarbons are converted to various intermediate hydrocarbon radicals such as $CH_3$, $CH_2$, CH, etc., where methane is used. The substrate is maintained at a temperature which promotes nucleation and growth of diamond from hydrocarbon radicals.

For making multilayer substrate 2, diamond layer 4 may also be deposited by chemical vapor deposition using a method similar to that disclosed in U.S. Pat. No. 5,270,077 (which is incorporated herein by reference), which discloses a method of using a convex substrate of molybdenum for combating the stress of diamond films during and after delamination.

Multilayer substrate 2 may also be made in the manner disclosed in U.S. Pat. No. 5,190,823 (which is incorporated herein by reference), wherein a silane layer is applied onto a molybdenum substrate so that the deposited diamond thickness in a hot filament reactor was able to increase from 10 to 20 microns to 100 microns, even as thick as 300 microns, without delamination.

Multilayer substrate 2 may also be made in a manner disclosed in any one of the following US patent documents. U.S. Pat. No. 6,414,338 (which is incorporated herein by reference) discloses a method depositing a diamond on molybdenum foil as a substrate with rhenium hot filament plasma with a reaction gas mixture of hydrogen and methane. U.S. Pat. No. 6,981,465 (which is incorporated herein by reference) discloses a method of using hot filament plasma for chemical vapor deposition of diamond on to a silicon substrate. U.S. Pat. No. 4,707,384 (which is incorporated herein by reference) discloses a method of using a hot filament CVD process to deposit a diamond film onto a substrate of carbides, nitrides, carbonitrides, oxycarbides, and borides of transitional metals. In this latter patent, having diamond film stick on to the substrate was a challenge and this patent discloses how to interpose an intermediate layer between the diamond film and the substrate to achieve better adhesion of diamond film on to the substrate.

Such interposed intermediate layer is mainly titanium carbide which has a good affinity to diamond by monolayer bonding, mainly through physical interactions of van de Waal's forces. US 2005/0064097 (which is incorporated herein by reference) discloses a method of growing a few microns of diamond film onto an iron-based substrate by a pretreatment with boron to form iron borides. The diamond film did not delaminate. However, the diamond film has a stress of 2 GPa with a Raman shift to 1335 cm$^{-1}$ from 1332.54 cm$^{-1}$ for single crystal diamond, a positive shift of about 2.5 cm$^{-1}$, meaning there is a substantial compression stress on this diamond film. This patent publication teaches that the stress is reduced when the diamond thickness is only about 80 to 300 nm in thickness. Diamond films of about 40-50 microns are reported to have a stress of as high as 8 GPa, and some of them 1.4 GPa, determined by Raman shift. Removing cobalt metal from tungsten-carbide substrate allows for better adhesion of diamond film, having a stress of 500 MPa, over 30 microns to the tungsten carbide, by hot filaments for mechanical applications, as disclosed in U.S. Pat. No. 5,952,102 (which is incorporated herein by reference). U.S. Pat. No. 6,042,886 (which is incorporated herein by reference) discloses that roughing the surface of the grinding tool allows a hot filament CVD diamond film to stick to the surface of the grinding tool, otherwise, diamond would fail to stick, most probably due to the substantial stress of the diamond film. In addition, US 2005/0276979 and US 2005/0025973 (both of which are incorporated herein by reference) disclose using hot-filament CVD method to deposit 8 to 200 micron diamond film around diamond grits (10 to 75 microns) that were planted onto the surface of a composite of silicon carbide and silicon, 2 inches in diameter; the disclosed product was used for CMP (Chemical Mechanical Planarization) pads conditioning, heat spreader, and wear component.

Alternatively, polycrystalline diamond layer 4 may be deposited on composite layer 6 by chemical vapor deposition similar to that taught in U.S. Pat. Nos. 5,403,399 and 5,368,897 (both of which are incorporated herein by reference), wherein hydrogen and gaseous carbon are radicalized for diamond deposition onto a silicon substrate under the conditions of arc discharge jet plasma, or direct current thermal plasma. Diamond layer 4 may be deposited on composite substrate 6 in the manner disclosed in U.S. Pat. No. 5,314,652 (which is incorporated herein by reference) wherein a direct current arc plasma is used to deposit and separate a free-standing diamond film of a thickness between 200 to 1000 microns from a substrate made of molybdenum by applying an interlayer which is made of titanium nitride, titanium carbide, hafnium nitride, zirconium nitride, aluminum nitride, or aluminum oxide. U.S. Pat. No. 5,507,987 (which is incorporated herein by reference) discloses a method of using DC jet plasma to deposit diamond film and obtain a free standing diamond film of a thickness of as thick as 1270 microns. U.S. Pat. No. 5,792,254 (which is incorporated herein by reference) discloses using DC plasma to grow diamond film on a surface-treated graphite substrate with a gas mixture of hydrogen and methane. U.S. Pat. No. 5,897,924 (which is incorporated herein by reference) discloses using microwave plasma to grow diamond onto a substrate of glass. U.S. Pat. Nos. 7,306,778, 7,771,823, and 7,767,184 (all of which are incorporated herein by reference) disclose the use of DC plasma to deposit sub-100 nm diamond layer onto a polycarbonate substrate with acetylene as the carbon source. US 2010/0178730 (which is incorporated herein by reference) discloses a DC Plasma CVD apparatus for depositing a diamond film of 80 microns onto a molybdenum substrate. U.S. Pat. No. 7,833,581 (which is incorporated herein by reference) discloses a method of coating a metallic substrate like titanium by forming a diamond film via multiple step increases in deposition temperatures throughout the diamond film growth.

U.S. Pat. Nos. 5,480,686 and 5,418,018 (both of which are incorporated herein by reference) disclose forming a layer of polycrystalline diamond by deposition on a composite layer by chemical vapor deposition using water-based plasma discharges. This process involves alcohols and hydrocarbons as carbon source and water as oxygen source for reactive oxygen etching off graphitic species.

U.S. Pat. Nos. 5,433,977, 5,505,158 and 5,665,430 (all of which are incorporated herein by reference) disclose forming a layer of polycrystalline diamond by chemical vapor deposition using a torch generated from high purity oxygen and acetylene gases under conditions of combustion flame. These patents disclose that a typical 10 micron thickness of diamond film is deposited on to a substrate of a composite that is made of tungsten carbide and cobalt and/or substrate of silicon nitride. U.S. Pat. No. 5,491,028 (which is incorporated herein by reference) discloses a method of depositing a diamond film onto a surface of WC—Co (tungsten-carbide-cobalt) composite by combustion flame for increasing diamond adhesion by adding a high-temperature binder.

U.S. Pat. No. 5,902,563 (which is incorporated herein by reference) discloses that a layer of polycrystalline diamond may be deposited by chemical vapor deposition which a gas mixture of hydrogen and methane is radicalized for diamond deposition onto a silicon and or molybdenum substrate under the conditions of radio frequency (RF, 3 kHz to 300 GHz) plasma, or, very high frequency (VHF, 50 to 300 MHz) plasma.

U.S. Pat. No. 5,302,231 (which is incorporated herein by reference) discloses that the layer of polycrystalline diamond may be deposited by chemical vapor deposition in which hydrogen is deficient and other alternative chemicals such as halogenated carbon molecules ($CCl_4$, $CF_4$, $CBr_4$, and $CI_4$) are used, instead of typical hydrogen and methane, for diamond growth. U.S. Pat. No. 5,071,677 (which is incorporated herein by reference) discloses a process of using a gas mixture capable of supplying carbon, hydrogen and halogen to deposit diamond onto a substrate at elevated temperatures.

U.S. Pat. No. 5,154,945 (which is incorporated herein by reference) discloses that a layer of polycrystalline diamond may be deposited by chemical vapor deposition by using infrared lasers from a gas mixture of methane and hydrogen, from pure carbon in the form of carbon soot. U.S. Pat. No. 4,948,629 (which is incorporated herein by reference) discloses using ultraviolet lasers from organic acid to deposit a polycrystalline diamond layer.

U.S. Pat. No. 5,474,808 (which is incorporated herein by reference) discloses that a layer of polycrystalline diamond may be directly deposited on a composite surface that is seeded by applying diamond particles, optionally, which are mixed with a liquid, aqueous or non-aqueous.

US 2008/0256850 (which is incorporated herein by reference) discloses a method of coating a piece of diamond with varied thickness of silicon carbide for the purpose of oxidation resistance and unique optical signature resulting from coating diamond surface with silicon carbide of varied thickness. US 2002/0015794 (which is incorporated herein by reference) discloses a method of coating CVD diamond with a thin layer of carbide/ductile-metal film, which is subsequently bonded to a cemented carbide layer comprising nickel, cobalt, iron, or an alloy that contains one or more of these metals. Free-standing CVD diamond is expensive and a large piece of large CVD diamond is hard to get. This process seems to be uneconomical. However, such treatments may be applicable for diamond layer surface of the present inventive multiple substrate comprising at least a diamond layer and a composite layer that comprises diamond and silicon carbide, and, optionally, silicon.

Method of Characterization

Images of Scanning Electron Microscopy (SEM) were collected on a Tescan's Vega scanning electron microscope equipped with an energy dispersive analysis X-Ray (EDAX) detector.

Raman spectra were collected via a confocal Raman microscope. Laser Raman spectroscopy is widely used as a standard for the characterization of diamond, single crystal or polycrystalline. It provides readily distinguishable signatures of each of the different forms (allotropes) of carbon (e.g., diamond, graphite, buckyballs, etc.). Combined with photoluminescence (PL) technology, Raman spectra offers a non-destructive way to study various properties of diamond including phase purity, crystal size and orientation, defect level and structure, impurity type and concentration, and stress and strain of diamond crystallites and films. In particular, the width (full-width-half-maximum, FWHM) of the first order diamond Raman peak at 1332 $cm^{-1}$, as well as the Raman intensity ratio between diamond peak and graphitic peaks (D-band at 1350 $cm^{-1}$ and G-band at 1600 $cm^{-1}$), is a direct indicator of diamond quality. Furthermore, the stress and strain levels in diamond grains and films can be estimated from diamond Raman peak shift. It has been reported that diamond Raman peak shift rate under hydrostatic stress is about 3.2 $cm^{-1}/GPa$, with peak shifting to lower wavenumber under tensile stress and higher wavenumber under compressive stress. The Raman spectra presented herein were collected using a confocal microscope with 514 nm excitation laser. More information about using Raman spectroscopy to characterize diamond is also available in the references (1) A. M. Zaitsev, *Optical Properties of Diamond*, 2001, Springer and (2) S. Prawer, R. J. Nemanich, *Phil. Trans. R. Soc. Lond.* A (2004) 362, 2537-2565.

Reflective UV-Vis-NIR Spectroscopy was collected via a UV/Vis/NIR spectrometer.

Density was determined by water immersion in accordance with ASTM C135-86.

Young's modulus was determined by ultrasonic Velocity in accordance with ASTM E494-95.

Coefficient of thermal expansion (CTE) was determined by a dilatometry technique in accordance with ASTM E 831.

Thermal conductivity is measured by a laser flash technique in accordance with ASTM E 1461.

Method of Chemical Vapor Deposition of Diamond by Microwave Plasma.

Figure 3:
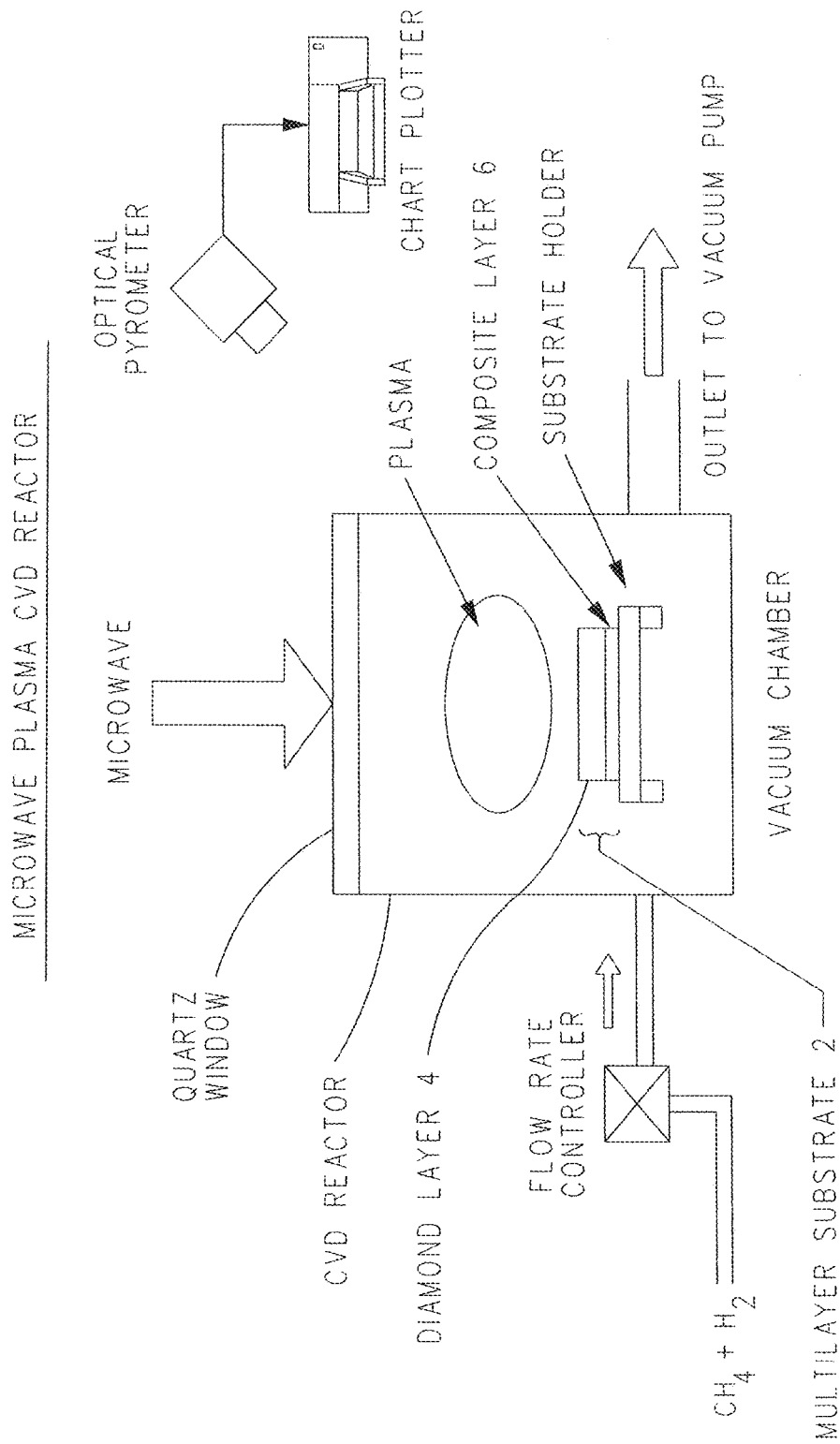
FIG. 3 is a schematic diagram of an exemplary microwave plasma chemical vapor deposition (CVD) system that can be used for depositing the diamond layer on the composite layer to form the multilayer substrate of FIG. 1.

Chemical vapor deposition of diamond enhanced by microwave plasma is known in the art and has been substantially discussed herein. FIG. 3 shows a schematic diagram of microwave plasma CVD system that was used in carrying out the deposition of diamond layer 4 on composite layer 6. Specifically, a mixture of reactive gases containing hydrogen and methane was flowed into the microwave plasma CVD reactor and the flow rates of hydrogen and methane were controlled by independent mass flow controllers. The exhausted gas flows out the CVD reactor, typically to a vacuum pump. The microwave is typically generated by a magnetron and guided to a reactor through a quartz window. Inside the reactor, the microwave energy is converted into plasma which radicalizes hydrogen molecules into hydrogen free radicals, as well as methane molecules into methyl free radicals (CH3), methylene free radicals (CH2), methyne free radicals (CH), and the secondary or tertiary free radicals that contain two or more carbons. At the bottom of the reactor, there sits a substrate holder that supports the substrate. The composite layer 6 comprising diamond and silicon carbide, and, optionally, silicon as the substrate for diamond growth sits on the substrate holder.

While the plasma is on, the radicalized free radicals that contain carbon bombard the surface of the substrate, which leads to carbon fixation by a mechanism called "hit and stick". Then, the hydrogen free radicals bombard the fixed surface carbon species that still contain hydrogen atoms, and abstract the hydrogen atom(s) off such fixed carbon species, resulting in the formation of surface carbon free radicals for forming C—C bonds containing less number of hydrogen atoms until all hydrogen atoms are abstracted. Some pure carbon to carbon bonding may be $sp^3$ in nature, which is desirable for diamond lattice. Some pure carbon to carbon bonding may be $sp^2$ in nature, which is undesirable since it is graphitic in nature. However, hydrogen free radicals are able to strip $sp^2$ carbon off the graphitic species faster than strip $sp^3$ carbon off the diamond lattice.

It is well known in the art that the concentrations of hydrogen and methane in the gas mixture are critical parameters for diamond growth, in addition to the growth temperature, if the plasma size is tuned into a size that is large enough to cover the surface of the substrate; the microwave power and pressure inside the CVD reactor are highly substrate-size-dependent. A person skilled in the art should be able to follow this disclosed procedure and instructions to tune his or her plasma to a proper size that is large enough to cover substrates of different sizes for the purposes of seeding, deposition and growth of quality diamond.

Example 1

Preparing a Composite Layer 6 Comprising Diamond and Silicon Carbide, and, Optionally, Silicon, which is Used for Making Multilayer Substrate 2

A detailed process of making composite layer 6 comprising diamond and silicon carbide, and, optionally, silicon is disclosed hereinafter in Example 4 and Example 5 and in U.S. Pat. No. 8,474,362 (which is incorporated herein by reference). The basic process is (1) to mix predetermined amounts of diamond particles (76 microns in diameter, 300 microns in diameter, and 500 microns in diameter) and silicon carbide (54 grit, 240 grit, or 500 grit) with a binder (phenolic resin) and reagent grade alcohol followed by mixing and casting into a rubber mold under vibration, with a periodical removal of the liquid from the surface. (2) The mold is then put into an oven and heated at 140° C. for two to three hours. The oven with the rubber mold containing the content, called a preform, is then cooled to ambient temperature. The preform is then removed from the rubber mold and placed onto a graphite plate, which was then placed into a furnace with an inert environment. The interior of the furnace with the preform therein was then held at elevated temperatures, such as 650° C., for 2 hours, followed by cooling to room temperature, whereupon the preform was carbonized. The preform was then soaked with phenolic resin and carbonized a second time under similar conditions. (3) The preform was then placed inside a graphite boat along with chunks of silicon, which was then placed inside a vacuum sintering furnace. The furnace was evacuated, e.g., to a pressure below 0.1 torr, and the interior temperature of the furnace was raised to about 1450° C., and held for 1 hour. The temperature in the interior of the furnace was then reduced to room temperature. As a result, silicon metal had melted and wicked into the preform and reacted with carbon, which could be from diamond, graphite, and carbonaceous species, to form silicon carbide, resulting in a composite comprising diamond and silicon carbide, and optionally, silicon, if there was some excess or unreacted silicon left.

An alternative procedure includes skipping the steps of adding alcohol and casting into a rubber mold, instead, having a step of pressing the mixture of silicon carbide, diamond, and phenolic resin in a die and forming a preform. Then the preform was carbonized at an elevated temperature, e.g., 600° C., in the presence of an inert atmosphere, followed by silicon infiltration at 1483° C. for a period of time under vacuum. This alternate procedure resulted in composite layer 6 that was fully dense, that is, free of porosity. The produced composite layer 6 comprised diamond and silicon carbide, and optionally, silicon if there was excess or unreacted silicon left in composite layer 6.

The following Table 1 shows the physical properties, including density, Young's modulus, coefficient of thermal expansion (CTE), and thermal conductivity, for composite layer 6 (that were made according to the above described processes) comprising diamond and silicon carbide, and optionally, silicon if there is an excess or unreacted silicon, in comparison with the physical properties of a standard product of reaction-bonded silicon carbide (RBSC) composite. As can be seen in Table 1, as the diamond content (or loading) increases from 0% to 42% and to 70% (by volume), the density of composite layer 6 increases from 2.95 g/cm$^3$ to 3.27 g/cm$^3$, and to 3.30 g/cm$^3$, respectively. At the same time, the Young's modulus increases from 350 GPa to 630 GPa, and to 700 GPa, respectively. Note that the increases in both density and Young's modulus are not exactly linearly correlated with the increase in diamond loading level, which is unexpected. Pure diamond's density is reported to be about 3.52 g/cm$^3$ and pure diamond's Young's modulus is reported to be about 1,220 GPa. Nonetheless, as the diamond loading level in the composite increases, the physical properties such as density and Young's modulus increasingly resembles pure diamond's properties.

Table 1 also shows that as the diamond loading level (by volume) increases from 0% to 42%, and to 70%, the coefficient of thermal expansion (CTE) decreases from 2.9×10$^{-6}$/m/m-K to 1.5×10$^{-6}$/m/m-K, and to 1.2×10$^{-6}$/m/m-K, respectively, while the coefficient of thermal expansion for pure diamond is 1.0×10$^{-6}$/m/m-K. By linear model calculations, one would predict that the coefficient of thermal expansion for the composite comprising 42% diamond would only be reduced to 2.1×10$^{-6}$/m/m-K, and that for the composite comprising 70% diamond to 1.6×10$^{-6}$/m/m-K, which is very surprising. Nevertheless, such outcomes further indicate that as the diamond loading level (by volume) increases, composite layer 6 comprising diamond and silicon carbide and, optionally, silicon increasingly resembles diamond with respect to diamond's physical properties, particularly, in the coefficient of thermal expansion.

Even though an increase in diamond loading level (by volume) results in an increase in thermal conductivity from 170 W/m-K for the RBSC Std., to 450 W/m-K for the composite layer 6 comprising 42% diamond, and to 625 W/m-K for the composite layer 6 comprising 70% diamond (which is far better than the thermal conductivity for pure copper (401 W/m-K)), these conductivities are still far lower than the theoretically predicted (calculated via a linear model) thermal conductivities (981 W/m-K for the composite layer 6 comprising 42% diamond and 1,521 W/m-K for the composite layer 6 comprising 70% diamond), which is highly unexpected. Nevertheless, the outcomes continue to support the conclusion that the composite layer 6 comprising diamond and silicon carbide, and, optionally, silicon increasingly resembles pure or natural diamond in its physical properties as the diamond loading level increases.

TABLE 1

Density, Young's modulus, coefficient of thermal expansion (CTE), and thermal conductivity of a composite layer comprising diamond and silicon carbide, and optionally, silicon, in comparison with those of a standard reaction bonded silicon carbide (RBSC) composite comprising of silicon carbide and silicon.

| Property | RBSC Std. | RBSC + 42% Diamond | RBSC + 70% Diamond |
|---|---|---|---|
| Density (g/cm$^3$) | 2.95 | 3.27 | 3.30 |
| Young's Modulus (GPa) | 350 | 630 | 700 |
| CTE, 20-100° C. (/K) | 2.9 × 10$^{-6}$ | 1.5 × 10$^{-6}$ | 1.2 × 10$^{-6}$ |
| Thermal Conductivity (W/m-K) | 170 | 450 | 625 |

With a process similar to procedures and processes described above, multiple pieces of composite layer 6 comprising diamond and silicon carbide, and, optionally, silicon were made with different geometrical dimensions and were used as substrates for chemical vapor deposition of a diamond layer 4 in a microwave plasma reactor, which will be further described hereinafter, in addition to the description of the method of chemical vapor deposition of diamond by microwave plasma discussed previously.

Example 2

Strong Anchoring of a Diamond Layer 4 onto Diamond Particles in a Composite Layer 6 Comprising Diamond and Silicon Carbide, and, Optionally, Silicon by Continued Diamond Growth onto Exposed Diamond Particles of the Composite Layer 6

A composite layer 6 (68 mm in diameter and 12 mm in thickness) comprising 40% (by volume) diamond with the balance being silicon carbide and, possibly, silicon, was used as a substrate in a microwave plasma chemical vapor deposition (CVD) reactor. A mixture of 1850 mL/min hydrogen and 13.7 mL/min methane was flowed into the microwave plasma CVD reactor. After initiating a plasma, the microwave power and the reactor pressure were tuned so that the plasma size covered composite layer 6, and the temperature of composite layer 6 was controlled at 820° C. by cooling a substrate holder that supported composite layer 6 in the microwave plasma CVD reactor. After about 20 hours of chemical vapor deposition of diamond layer 4 on the composite layer 6, the reaction was stopped, and the multilayer substrate 2 was removed from the microwave plasma CVD reactor and analyzed by optical microscope, scanning electron microscope, and Raman scattering spectroscopy. The results from Raman spectroscopy study confirmed that the grown diamond film or layer 4 was intact and that the newly grown diamond layer 4 was of high quality diamond with a sharp signature peak of Raman shift at about 1332 cm$^{-1}$. After about 20 hour's growth, it is estimated that the diamond layer 4 had a thickness of about 30 microns.

Figure 4B:
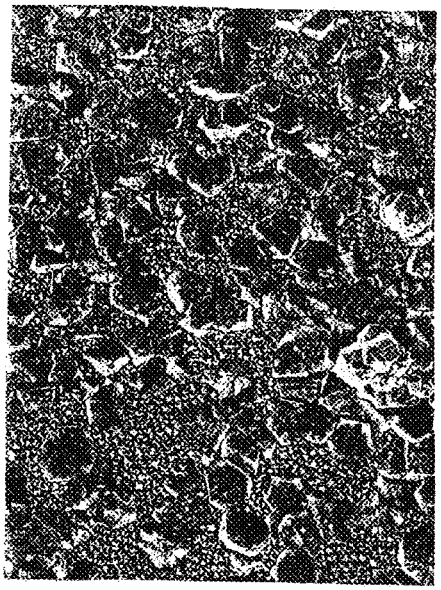
FIG. 4B is an SEM image of a diamond layer grown on the composite layer of FIG. 4A after about 20 hours of CVD deposition of diamond on the composite layer.
Figure 4C:
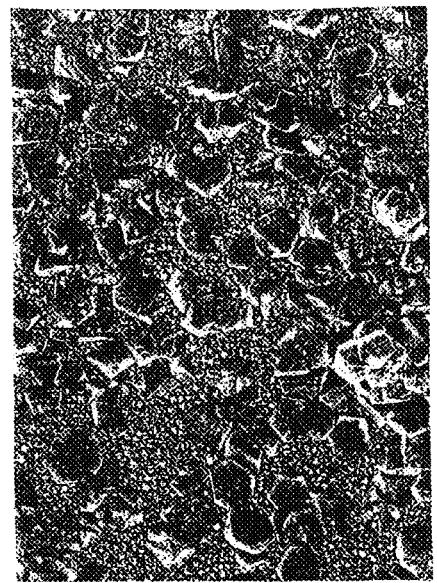
FIG. 4C is an SEM image of the growth surface of a diamond layer grown on the composite layer of FIG. 4A after about 117 hours of CVD growth of the diamond layer on the composite layer.
Figure 4A:
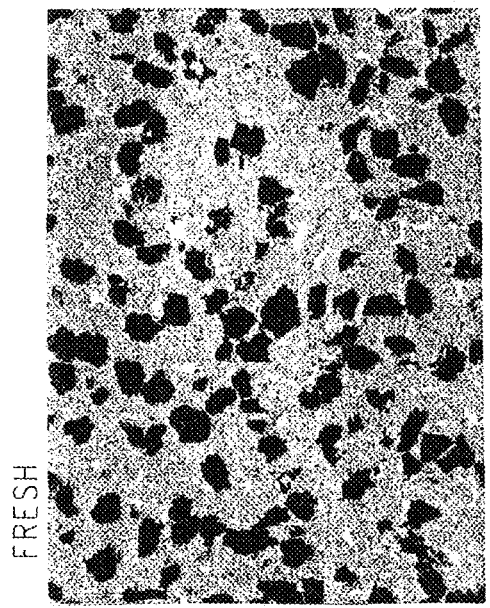
FIG. 4A is an SEM image of the surface of a composite layer, like the composite layer of FIG. 1, prior to CVD deposition of diamond thereon.

FIG. 4A shows a SEM's back-scattering image of the surface of composite layer 6 prior to its use in the chemical vapor deposition of diamond layer 4 thereon. Due to electron density differences, diamond particles in FIG. 4A show as dark images, silicon carbide shows as gray color continuous phase, and silicon shows as separated bright gray color that fills the pores of the composite, which shows that composite layer 6 comprising diamond, silicon carbide, and silicon is highly dense. The diamond particles of composite layer 6 exposed at the surface of composite layer 6 have largest dimensions between about 10 to 30 microns.

After about 20 hours' growth of about 30 microns of diamond layer 4 onto the surface of composite layer 6, it was surprising to discover that the grown diamond particles grow bigger and the areas of silicon carbide and silicon in composite layer 6 are seeded with small diamond crystals, as shown the multilayer substrate of FIG. 4B.

The multilayer substrate of FIG. 4B was then returned back to the microwave CVD reactor for additional diamond deposition for a total of 117 hours under the same gas flow conditions. The multilayer substrate was then removed from the CVD reactor and it was found that diamond layer 4 was still intact, which is also surprising, since the thickness of diamond layer 4 was estimated to be about 190 microns. Heretofore, a diamond layer 4 of a thickness of about 190 microns would typically delaminate from a molybdenum or tungsten substrate. It was further surprising to discover that the original diamond crystals were then about 100 microns or larger, while the small diamond crystals noticed after 20 hours of growth between large diamond grains had grown from a few microns to about 20 to 30 microns, as shown in FIG. 4C.

Based on the foregoing observations, the multilayer substrate 2 comprising a diamond layer 4 and a composite layer 6 that comprises diamond and silicon carbide, and, optionally silicon has numerous advantages. Chemically, diamond layer 4 continues to grow, at a crystal lattice level, on to the exposed diamond crystals on the surface of composite layer 6. It is envisioned that diamond layer 4 is strongly anchored to the matrices of composite layer 6. Such crystal-lattice anchoring may lead to multilayer substrate 2 being intrinsically strong. This advantage may ensure that multilayer substrate 2 has both exceptional capability and exceptional capacity to sustain many physical and chemical challenges, such as in mechanical applications involving enormous amounts of external forces, stress and temperature fluctuations. Such advantage also leads to the benefit of being able to grow any thickness of diamond layer 4 onto the composite layer 6, insofar as a CVD reactor allows.

From the perspective of physical properties, composite layer 6 increasingly resembles diamond layer 4, as the diamond loading level increases, shown in Example 1 above. Such resemblances in physical properties allow these two different layers of multilayer substrate 2 to interact better, which helps to sustain external stress more effectively, particularly, the coefficients of thermal expansion of diamond layer 4 and composite layer 6, which leads to advantages of generating lower thermal stress due to temperature fluctuations.

The area of physical interaction between silicon carbide or silicon and seeded diamond particles decreases, and the area having chemical interactions through diamond lattice bonding increases as the diamond loading level in the composite increases. It is believed that interactions resulting from van der Waals forces are probably magnitudes lower than interactions resulting from chemical bonding, particularly, sp$^3$ C—C bonding in the diamond crystal lattices. All of these observations suggest that multilayer substrate 2 has advantages over the prior art. However, the scope of the present invention is not to be limited by the explanation offered herein.

Figure 5:
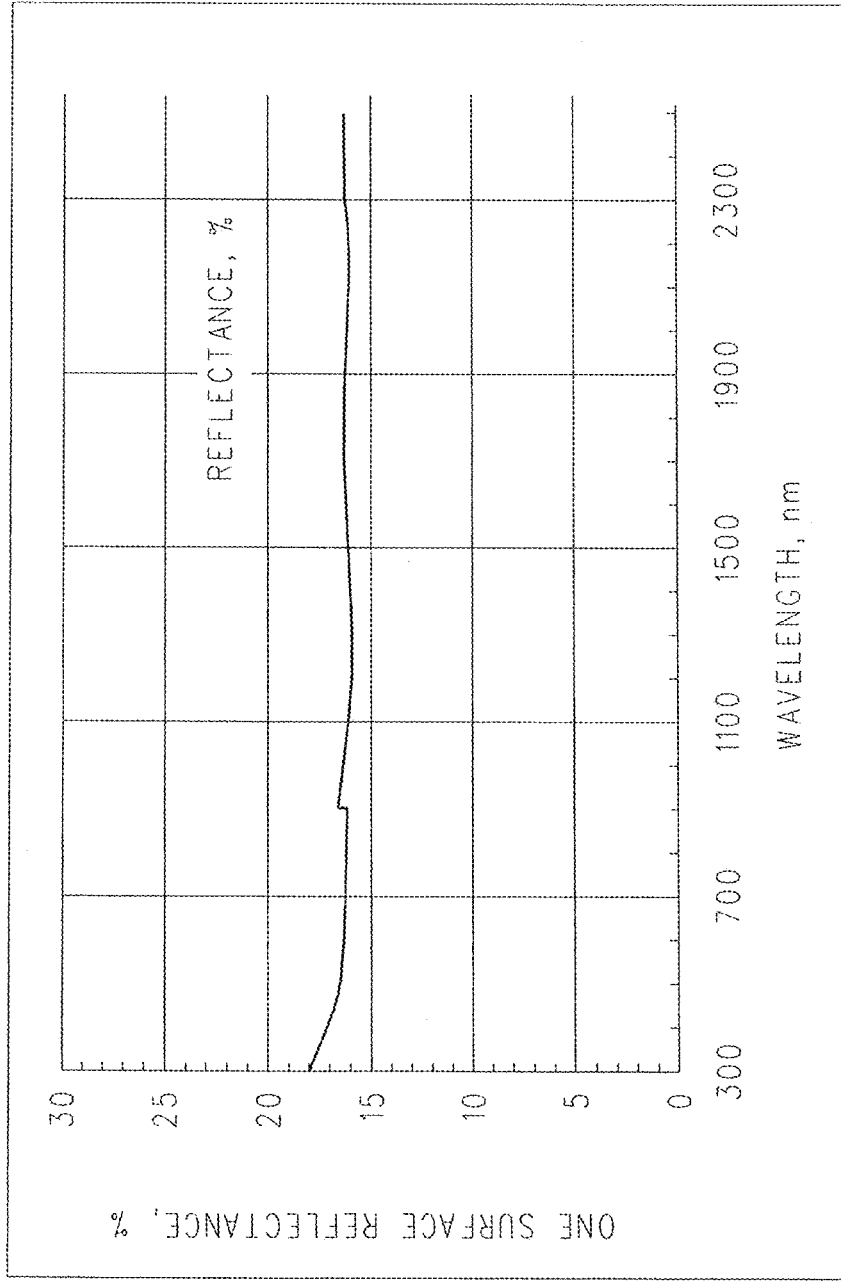
FIG. 5 is a UV-Vis-NIR reflective spectroscopy graph of the diamond layer of FIG. 4C after lapping and polishing.

Multilayer substrate 6 comprised of diamond layer 4 (about 190 microns thick) and composite layer 6 comprising 40% (by volume) diamond with the balance being silicon carbide, and, possibly silicon was lapped and polished to an optical finish. Then the UV-Vis-NIR reflectance spectroscopy of diamond layer 6 was collected from a wavelength of 2500 nm to a wavelength of 300 nm at a reflection angle of 8° which essentially only allows collecting the reflecting light from a single surface, as shown in FIG. 5. The single surface reflectance in this spectrum is in a good agreement with high quality diamond reflection indices corresponding to these wavelengths.

Example 3

A Thick Diamond Layer 4, of Low Stress or Reduced Stress, Chemically Anchored onto Composite Layer 6

A composite layer 6 (140 mm in diameter and 10 mm in thickness) comprising 70% (by volume) of diamond particles with the balance being silicon carbide and, possibly, silicon was used as a substrate for the chemical vapor deposition of a diamond layer 4. A mixture of 1850 mL/min hydrogen and 13.7 mL/min methane was flowed into a microwave plasma CVD reactor (see FIG. 3). After initiating the plasma, the microwave power and the reactor pressure were tuned so that the plasma size covered composite layer 6, and then, the substrate temperature was controlled at 820° C. by cooling the substrate holder. After about 17 hours of chemical vapor deposition of diamond layer 4, the reactions were stopped, and multilayer substrate 2 was removed from the microwave CVD reactor. A diamond layer 4 of about 30 microns was observed on the composite layer 6 cohesively. The multilayer substrate 2 with diamond layer 4 of about 30 microns on composite layer 6 comprising about 70% diamond was then returned to the microwave CVD reactor for additional diamond growth for a total growth time of about 130 hours. The reactions of microwave chemical vapor deposition of diamond were then stopped again and multilayer substrate 2 was removed from the microwave CVD reactor. A diamond layer 4 of about 200 microns was on composite layer 6 comprising 70% diamond cohesively. This multilayer substrate 2 was then returned again to the microwave reactor for yet additional diamond growth for a total of about 290 hours. After the reactions were stopped, multilayer substrate 2 was removed from the microwave CVD reactor. Surprisingly, a diamond layer 4 of about 450 microns was still on composite layer 6 cohesively. Typically, a diamond layer 4 of such a thickness, around 450 microns, on a substrate (such as tungsten) of 140 mm in diameter is difficult to survive from delamination. This piece of multilayer substrate 2 comprising a diamond layer 4 and a composite layer 6 that comprises diamond and silicon carbide, and, optionally, silicon was identified as substrate 1A175.

Figure 6:
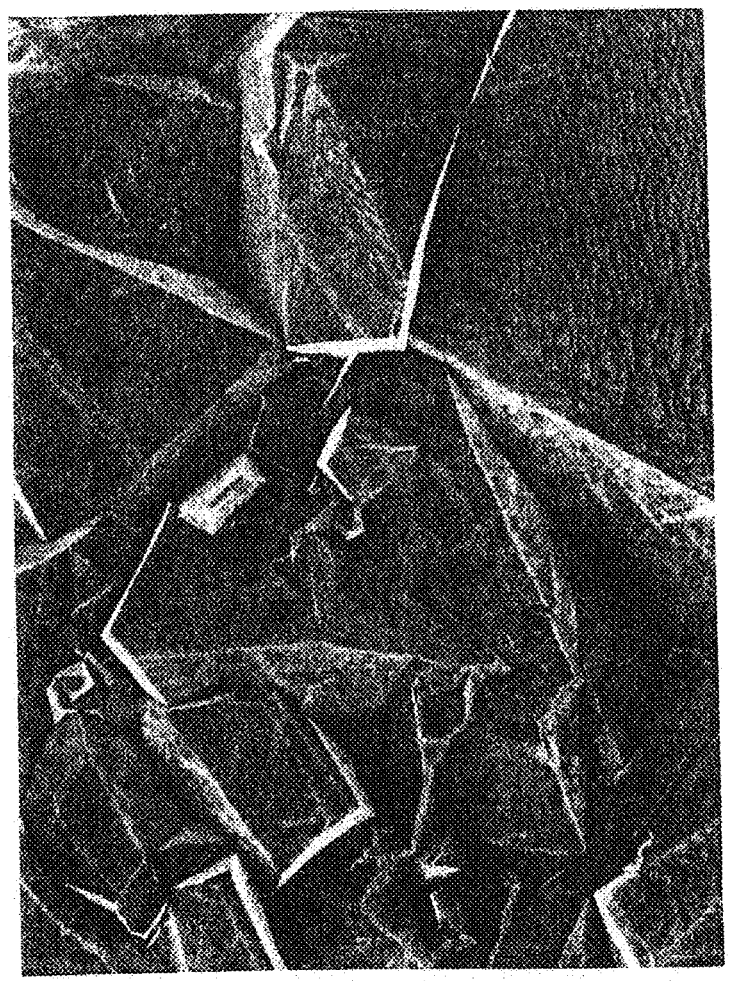
FIG. 6 is an SEM image of the growth surface of the center of a diamond layer that was CVD grown on a composite layer comprising 70% diamond (by volume)

FIG. 6 shows an SEM image of the growth surface of the center of diamond layer 4 (that was deposited for about 290 hours in a microwave CVD reactor) on composite layer 6, 140 mm in diameter, comprising 70% diamond (substrate 1A175). The grain size of the diamond appears to be greater than a couple of hundred microns, while observing that smaller diamond grains that are still in the process of growth.

Figure 16A:
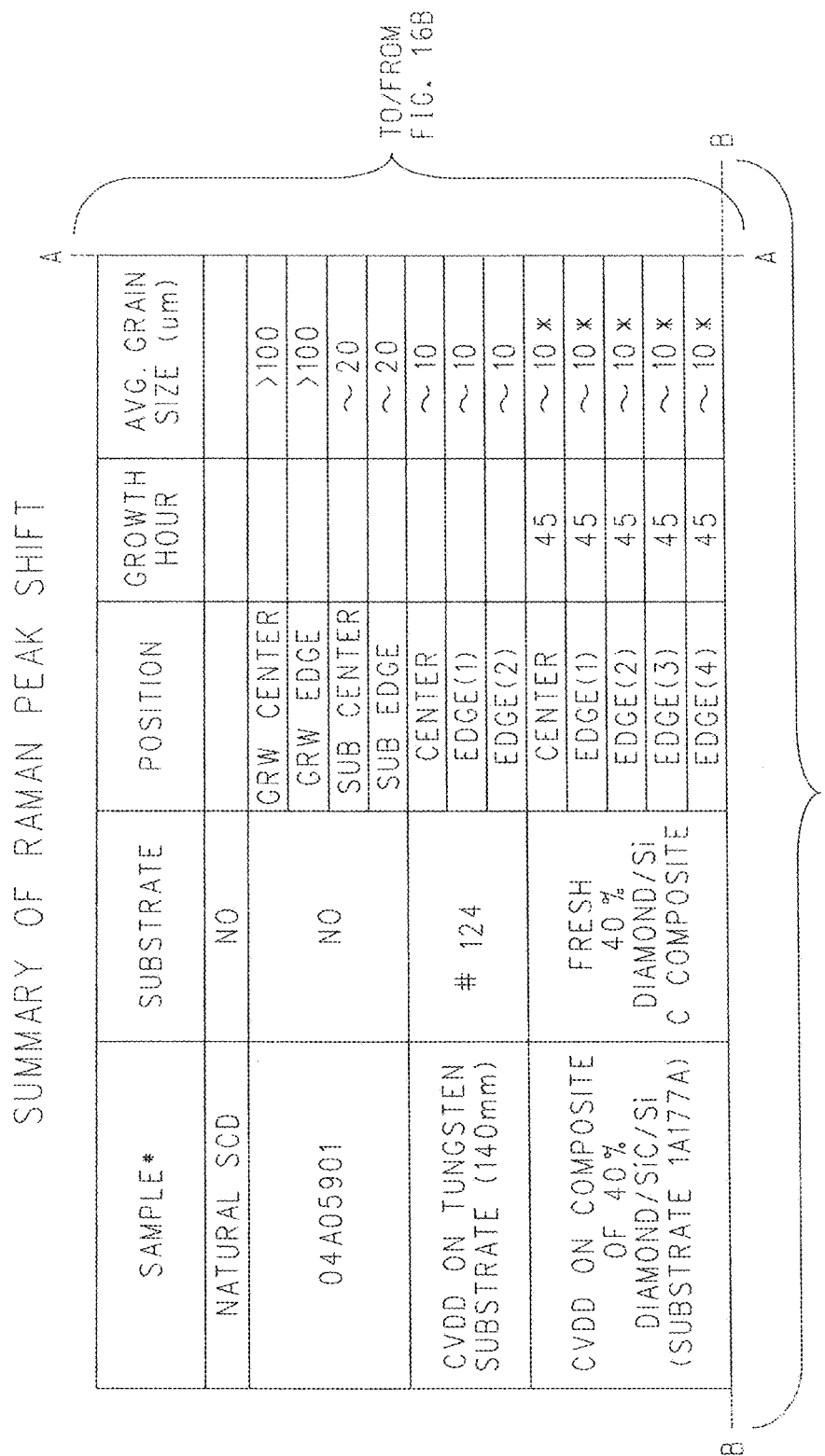
FIG. 16 is a chart of Raman data for a natural single crystal diamond (natural SCD), a grown free standing diamond window (04A05901), and diamond layers grown on various substrates (i.e., tungsten, a composite layer comprised of 40% diamond particles, a composite layer comprised of 70% diamond particles, and an SiC/Si substrate containing no diamond particles (1A178)), including the composite layers disclosed herein.

FIGS. 7A-7E show Raman spectra of diamond layer 4 of substrate 1A175 at five different locations, namely, center, north edge, east edge, south edge, and west edge. The diamond signature Raman peaks are located at 1332.75 $cm^{-1}$, 1333.27 $cm^{-1}$, 1333.52 $cm^{-1}$, 1332.45 $cm^{-1}$, 1332.89 $cm^{-1}$, respectively, with an average of 1332.98 $cm^{-1}$. The Raman peak widths (full-width-half-maximum, FWHM) are 3.20 $cm^{-1}$, 3.40 $cm^{-1}$, 3.82 $cm^{-1}$, 3.43 $cm^{-1}$, and 4.29 $cm^{-1}$, with an average of 3.63 $cm^{-1}$. The baselines of these Raman scattering spectroscopy are flat and the signature of $sp^2$ carbon-carbon bonding which associates with graphitic carbon in nature is not detectable. Therefore, the quality of diamond layer 4 of substrate 1A175 is high and even throughout the surface of multilayer substrate 2 of 140 mm in diameter. Raman data for a natural single crystal diamond (SCD), a grown free standing diamond window (04A05901), and diamonds grown on various substrates, including the composite layers disclosed herein, are shown in (FIG. 16).

Figure 8:
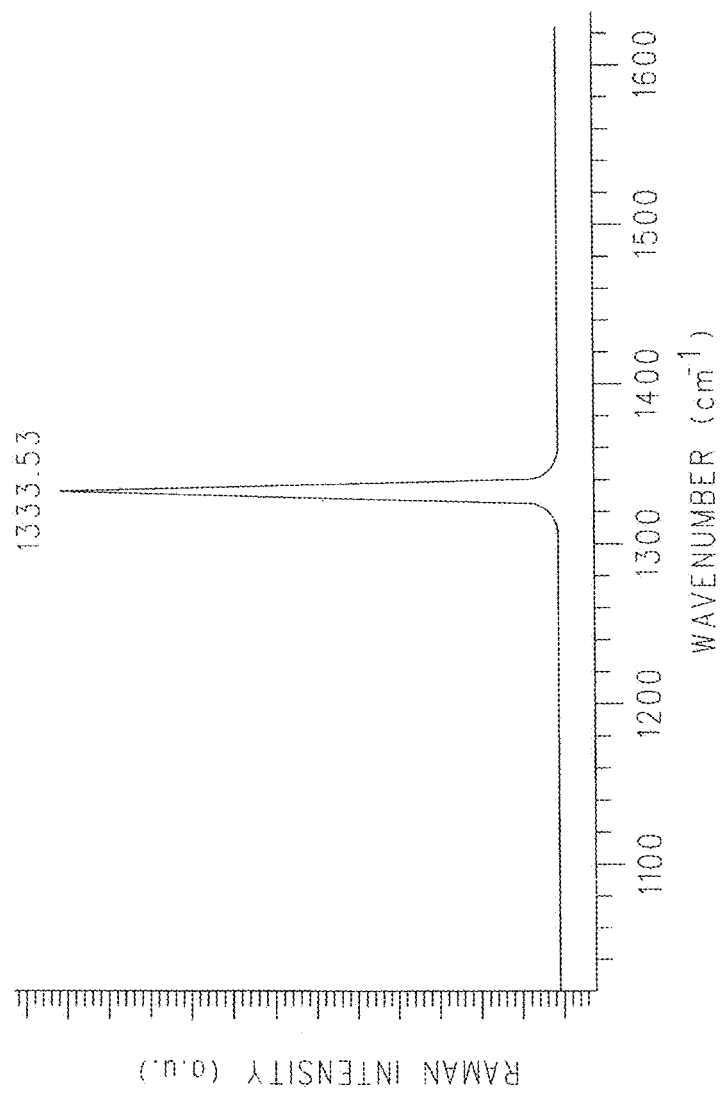
FIG. 8 is an exemplary Raman spectrum of a natural single crystal diamond.
Figure 9A:
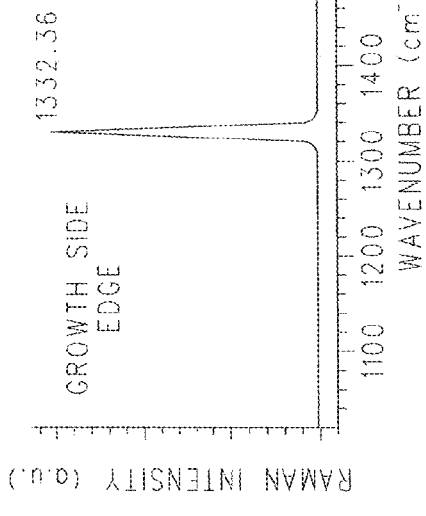
FIGS. 9A-9D are Raman spectra of a CVD optical diamond window collected at the center and the edge from the growth side and the nucleation side of the diamond, window.
Figure 9B:
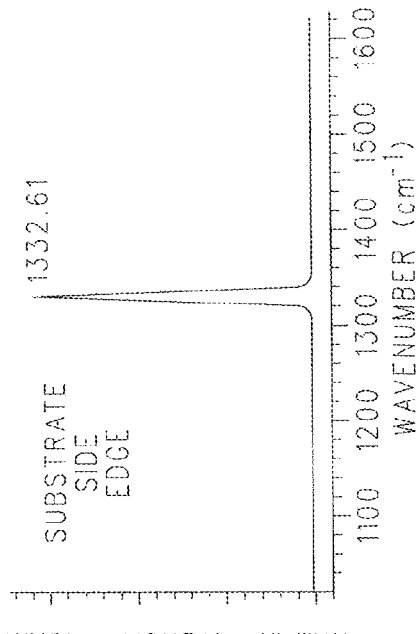
Figure 9C:
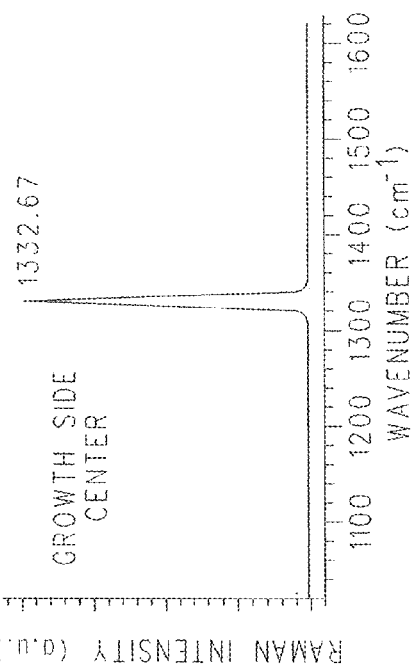
Figure 9D:
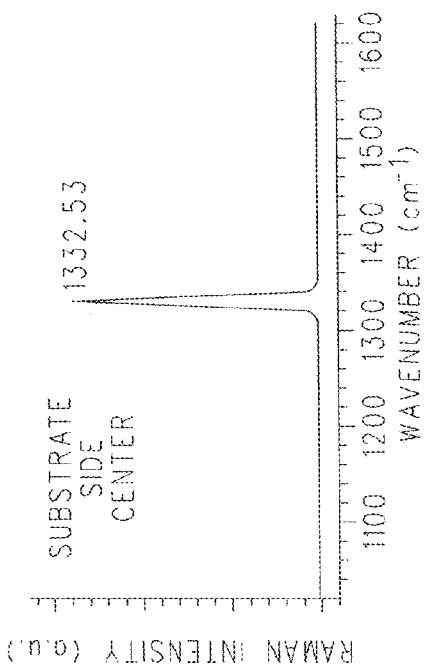

To better assess the quality of diamond layer 4 from the multilayer substrate 2, Raman spectra of a high quality natural single crystal diamond (natural SCD) were collected and used as a baseline. One of these spectra is shown in FIG. 8. The diamond signature Raman peak of this natural single crystal diamond is located at 1332.53 $cm^{-1}$, with its Raman peak width (full-width-half-maximum, FWHM) being 4.04 $cm^{-1}$, and the baseline of this Raman spectrum of the single crystal is also very flat and the signature of $sp^2$ carbon-carbon bonding which associates with graphitic carbon in nature is also not detectable. By comparing the Raman spectrum of a single crystal diamond in FIG. 8 and the Raman spectra of the diamond layer 4 of multilayer substrate 2 (substrate 1A175—FIGS. 7A-7E) it is observed that not only the quality of diamond layer 4 of multilayer substrate 2 is of high quality, but also that the stress of the diamond of diamond layer 4 of multilayer substrate 2 is low, evidenced by little Raman peak shifts from single crystal diamond's Raman peak (1332.53 $cm^{-1}$), +0.22 $cm^{-1}$ in the center, +0.74 $cm^{-1}$ in the north edge, +0.99 $cm^{-1}$ in the east edge, −0.08 $cm^{-1}$ in the south edge, and +0.36 $cm^{-1}$ in the west edge, with an average of +0.45 $cm^{-1}$. These results suggest that the stress of the diamond of the diamond layer 4 of multilayer substrate 2 (substrate 1A175) is exceptionally low, given a thickness of about 450 microns and a diameter of 140 mm. Typically, the stress of diamond of a diamond film increases with increase in the diamond film thickness and/or in the diamond film diameter (or dimension(s)).

To further illustrate the quality of multilayer substrate 1A175, consider the Raman spectra of a free-standing CVD optical Diamond Window (substrate 04A05901) (both surfaces were polished and finished for optical applications) which were collected at the center and at the edge, and from the growth side and from the nucleation side, as shown in FIGS. 9A-9D. The diamond signature Raman peaks of free-standing CVD diamond window 04A05901 are 1332.67 $cm^{-1}$, 1332.36 $cm^{-1}$, 1332.53 $cm^{-1}$, and 1332.61 $cm^{-1}$, with an average of 1332.54 $cm^{-1}$; and the Raman peak shifts from single crystal diamond's Raman peak (1332.53 $cm^{-1}$) are +0.14 $cm^{-1}$, −0.17 $cm^{-1}$, 0.00 $cm^{-1}$, and +0.08 $cm^{-1}$, respectively, with an average of +0.01 $cm^1$. This suggests that a piece of free standing diamond of high quality is subjected to no observable stress. The stress of diamond film 4 of substrate 1A175 results from the interaction of two different layers of materials at the interface, namely, diamond layer 4 and composite layer 6 comprised of diamond and silicon carbide, and, optionally, silicon.

Figure 10:
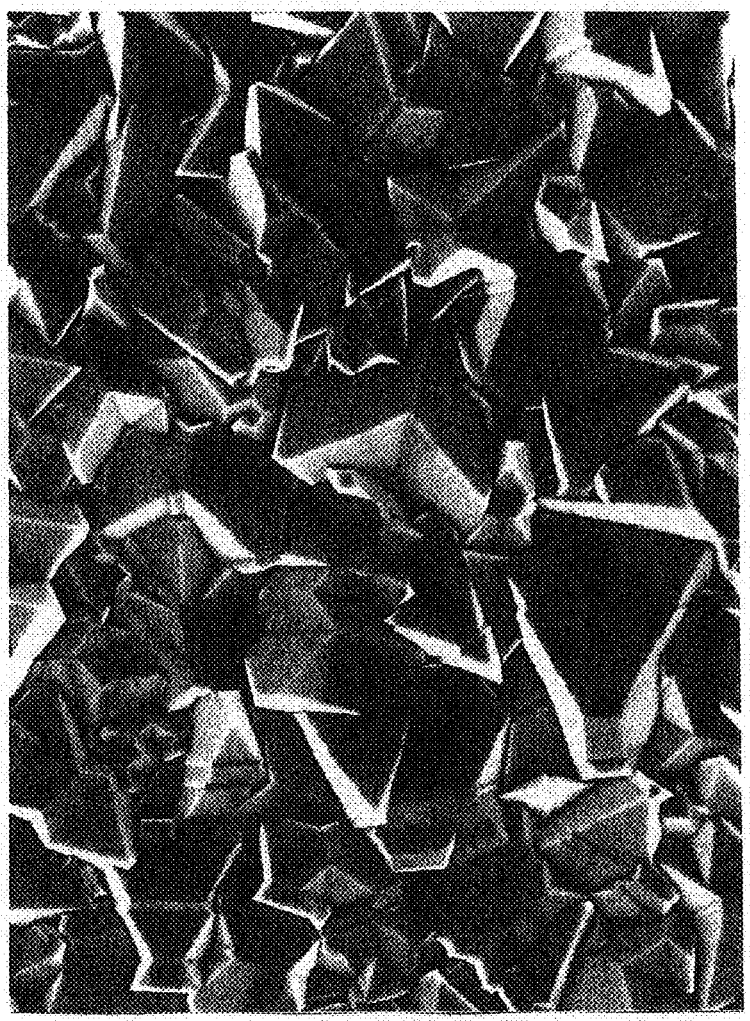
FIG. 10 is an SEM image of the center of a growth surface of a diamond layer that was CVD grown on a tungsten substrate.

With reference to FIGS. 10-11C, to further illustrate the quality of multilayer substrate 2 (substrate 1A175) comprised of diamond layer 4 and composite layer 6, a tungsten substrate of 140 mm with a thickness of 10 mm (substrate #124) was placed inside a microwave plasma CVD reactor (see FIG. 3). A mixture of 1850 mL/min hydrogen and 13.7 mL/min methane was flowed into the microwave plasma CVD reactor. After initiating the plasma, the microwave power and the reactor pressure were tuned so that the plasma size covered the tungsten substrate, and the temperature of the tungsten substrate was controlled at 820° C. by cooling. After 24 hours of chemical vapor deposition of a diamond layer on the tungsten substrate, the reaction was stopped, and the tungsten substrate with diamond layer thereof was removed from the microwave CVD reactor. The diamond layer still adhered to the tungsten substrate and the thickness of this diamond layer was estimated to be less than 30 microns. Typically, growing a diamond layer on a tungsten substrate for 24 hours or longer leads to delamination of the diamond layer or film from the tungsten substrate.

FIG. 10 is an SEM image of the growth surface at the center of the diamond layer or film that is grown on (and still adhered) to the tungsten substrate (i.e., substrate #124), with a grain size of about 20 microns or smaller.

FIGS. 11A-11C show three Raman spectra from the respective center, edge 1 and edge 2 of a diamond film grown on the tungsten substrate after overnight microwave CVD diamond growth. The diamond signature Raman peaks are located at 1335.85 $cm^{-1}$, 1335.87 $cm^{-1}$, and 1335.85 $cm^{-1}$, respectively, with an average of 1335.86 $cm^{-1}$. The Raman peak shifts from single crystal diamond's Raman peak (1332.53 $cm^{-1}$) are +3.32 $cm^{-1}$, +3.34 $cm^{-1}$, and +3.32 $cm^{-1}$, respectively, with an average of +3.33 $cm^{-1}$. This level of Raman peak shift from single crystal diamond suggests that, even though the diamond layer (e.g., shown in FIG. 10) is thinner than 30 microns, there exists a substantial level of stress between this thin diamond layer and the tungsten substrate. The stress of a diamond film on the tungsten substrate would be very high if the thickness of the diamond film were as thick as the diamond layer 4 of substrate 1A175 (about 450 microns), described above.

Example 4

For Multilayer Substrate 2, the Stress of Diamond Layer 4 May be Affected by the Diamond Loading in Composite Layer 6 Comprising Diamond and Silicon Carbide, and, Optionally, Silicon A composite layer 6 (140 mm in diameter and 10 mm in thickness) comprising 40% diamond loading (by volume) with the balance being silicon carbide and, possibly, silicon was first lapped by polishing slurries. Then, its surface was rubbed with diamond powders and flushed clean with isopropanol. Composite layer 6 was then used as a substrate for chemical vapor deposition of a diamond layer 4 in a microwave plasma CVD reactor. A mixture of 1850 mL/min hydrogen and 13.7 mL/min methane was flowed into the microwave plasma CVD reactor (see FIG. 3) after composite layer 6 was placed on the substrate holder. After initiating the plasma, the microwave power and the reactor pressure were tuned so that the plasma size covered composite layer 6, and the temperature of composite layer 6 was controlled at 820° C. by cooling the substrate holder. Chemical vapor deposition of diamond layer 4 on composite layer 6 to form multilayer substrate 2 continued for about 301 hours whereupon the reaction was stopped. Multilayer substrate 2 was then removed from the microwave CVD reactor. The deposited CVD diamond layer 4 of multilayer substrate 2 was observed to be about 480 microns thick and was cohesive to composite layer 6 comprising diamond and silicon carbide, and, possibly, silicon. Thus multilayer substrate 2 was identified as substrate 1A177B.

Figure 12:
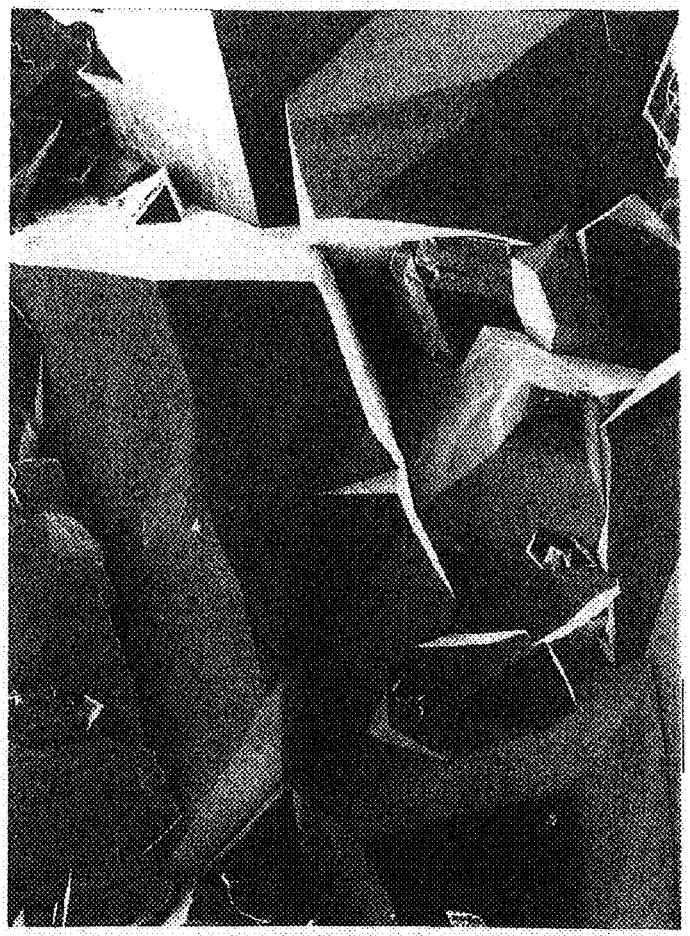
FIG. 12 is an SEM image of the growth surface of the center of a diamond layer that was CVD grown on a composite layer containing 40% diamond (by volume)
Figure 15A:
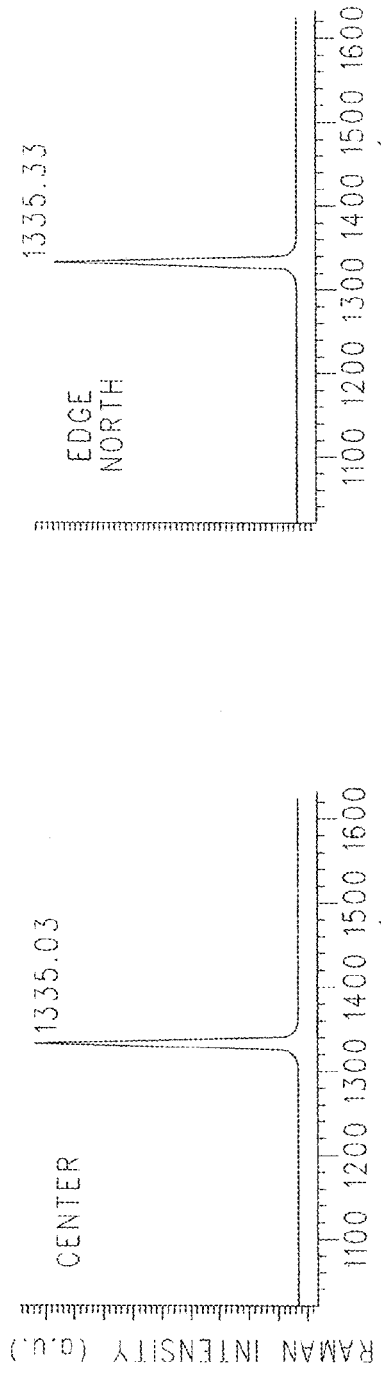
Figure 15B:
Figure 15C:
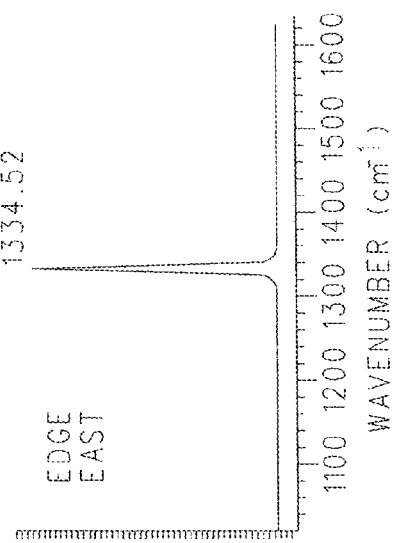

FIG. 12 shows SEM image of the growth surface at the center of diamond layer 4 (that was deposited for about 301 hours in the microwave CVD reactor) on a composite layer 6, 140 mm in diameter, comprising 40% diamond (substrate 1A177B). The grain size of the diamond is observed to be greater than a couple of hundred microns, while observing that smaller diamond grains that are still in the process of growth.

FIGS. 13A-13E show the Raman spectra of substrate 1A177B at five different locations, namely, center, north edge, east edge, south edge, and west edge. The diamond signature Raman peaks are located at 1333.67 $cm^{-1}$, 1334.35 $cm^{-1}$, 1333.43 $cm^{-1}$, 1333.62 $cm^{-1}$, 1333.58 $cm^{-1}$, respectively, with an average of 1333.73 $cm^{-1}$. The Raman peak widths (full-width-half-maximum, FWHM) are 3.20 $cm^{-1}$, 5.82 $cm^{-1}$, 3.42 $cm^{-1}$, 3.10 $cm^{-1}$, and 6.43 $cm^{-1}$, with an average of 4.39 $cm^{-1}$ (a quality close to that of a single crystal diamond which has a Raman peak width, or full-width-half-maximum, FWHM, at the half height of 4.04 $cm^{-1}$) and the baselines of these Raman scattering spectra are flat and the signature of $sp^2$ carbon-carbon bonding which is associated with graphitic carbon in nature is not detectable. Therefore, the quality of this diamond layer 4 is very high, throughout the surface.

Comparing the Raman scattering spectra of a natural single crystal diamond (FIG. 8) and the Raman scattering spectras of diamonds from diamond layer 4 of substrate 1A177B (FIGS. 13A-13E), it is noted that not only the quality of diamond layer 4 of multilayer substrate 2 is good, but also the stress of diamond of diamond layer 4 of substrate 1A177B is lower than that for a thin diamond layer (<30 microns) grown on a tungsten substrate (substrate #124; FIGS. 11A-11C), evidenced by its Raman peak shifts from single crystal diamond's Raman peak (1332.53 $cm^{-1}$), +1.14 $cm^{-1}$ in the center, +1.82 $cm^{-1}$ in the north edge, +0.90 $cm^{-1}$ in the east edge, +1.09 $cm^{-1}$ in the south edge, and +1.05 $cm^{-1}$ in the west edge, with an average of +1.20 $cm^{-1}$, while a thin diamond film (<30 microns) on tungsten substrate (substrate #124, FIGS. 11A-11C) has an average Raman peak shift of +3.33 $cm^{-1}$. These results suggest that the stress of the diamond of diamond layer 4 of multilayer substrate 2 (substrate 1A177B, having a composite layer 6 that contains 40% diamond particles) is still exceptionally low, given that diamond thickness is as thick as about 450 microns and the diameter is as large as 140 mm. However, with respect to the stress of the diamond of the diamond layer 4, substrate 1A177B (FIGS. 13A-13E) is in fact inferior to substrate 1A175 (FIGS. 7A-7E) since substrate 1A175's composite layer 6 has 70% diamond and 1A177B's composite layer 6 has only 40% diamond. Therefore, these results seem to suggest that a higher diamond loading (by volume) in composite layer 6 is more desirable, possibly due to (1) composite layer 6 comprising higher diamond loading more resembling natural diamond in its physical properties and (2) more diamond particles in composite layer 6 are exposed at the surface of composite layer 6 to which diamond layer 4 formed the CVD intrinsic $sp^3$ carbon-carbon diamond lattice bonds, so that the newly formed diamond layer 4 is anchored, with chemical interactions at a crystal lattice level, into the matrix of composite layer 6 comprising diamond and silicon carbide, and optionally, silicon.

Example 5

For Multilayer Substrate 2, the Stress of Diamond Layer 4 may be Affected by the Thickness of Diamond Layer 4 of Multilayer Substrate 2 Comprising Diamond Layer 4 and Composite Layer 6 that Comprises Diamond and Carbon Carbide, and, Optionally, Silicon The side of multilayer substrate 1A177B opposite diamond layer 4 of 140 mm in diameter and 10 mm in thickness, described in Example 4 above, was placed into a microwave CVD reactor for deposition of a diamond layer 4' (shown in phantom in FIG. 1) onto the surface of composite layer 6 opposite diamond layer 4. A mixture of 1850 mL/min hydrogen and 13.7 mL/min methane was flowed into the microwave plasma CVD reactor. After initiating the plasma, the microwave power and the reactor pressure were tuned so that the plasma size covered the surface of composite substrate 6 opposite diamond layer 4, and then, the temperature of composite layer 6 was controlled at 820° C. by cooling the substrate holder. Chemical vapor deposition of diamond layer 4' continued for about 50.5 hours whereupon the CVD reactions were stopped. Substrate 1A177B was removed from the microwave CVD reactor and the deposited CVD diamond layer 4' was observed to be about 80 microns thick, and was observed to be cohesive to the side of composite layer 6 opposite diamond layer 4. This multilayer substrate 2 was identified as substrate 1A177A.

FIGS. 14A-14F show the Raman spectra of diamond layer 4' of substrate 1A177A at five different locations, namely, center, north edge, east edge, south edge, and west edge. The diamond signature Raman peaks are located at 1333.93 $cm^{-1}$, 1332.99 $cm^{-1}$, 1333.40 $cm^{-1}$, 1332.93 $cm^{-1}$, 1332.98 $cm^{-1}$, respectively, with an average of 1333.25 $cm^{-1}$; and the Raman peak widths (full-width-half-maximum, FWHM) are 4.68 $cm^{-1}$, 6.35 $cm^{-1}$, 6.48 $cm^{-1}$, 4.42 $cm^{-1}$, and 5.31 $cm^{-1}$, with an average of 5.45 $cm^{-1}$ (a quality not as good as that of a single crystal diamond which has a Raman peak FWHM of 4.04 $cm^{-1}$, but still an excellent quality CVD diamond). The baselines of the Raman spectra shown in FIGS. 14A-14E are flat and the signature of $sp^2$ carbon-carbon bonding which associates with graphitic carbon in nature is not detectable. Therefore, the quality of the diamond layer 4' is high and relatively even throughout the surface of the substrate 1A177A.

By comparing the Raman scattering spectroscopy of a natural single crystal diamond (FIG. 8) and Raman scattering spectroscopy of the diamond of diamond layer 4' of substrate 1A177A (FIGS. 14A-14E), it is noted that not only the quality of the diamond of diamond layer 4' is good, but also the stress of the diamond of diamond layer 4' is much lower than that for a thin diamond layer 4 (<30 microns) grown on a tungsten substrate (FIGS. 11A-11C), evidenced by peak shifts from natural single crystal diamond's (FIG. 8) Raman peak (1332.53 $cm^{-1}$), +1.40 $cm^{-1}$ in the center, +0.46 $cm^{-1}$ in the north edge, +0.87 $cm^{-1}$ in the east edge, +0.40 $cm^{-1}$ in the south edge, and +0.45 $cm^{-1}$ in the west edge, with an average of +0.72 $cm^{-1}$, while the thin diamond layer 4 (<30 microns) on a tungsten substrate has an average Raman peak shift of 3.33 $cm^{-1}$, as shown in FIGS. 11A-11C.

These results suggest that the stress of the diamond of diamond layer 4' of substrate 1A177A (in this case, composite layer 6 comprises 40% diamond particles) is related to the thickness of diamond layer 4'. It is observed that as diamond layer 4' on composite layer 6 of multilayer substrate 2 grows thicker, the stress of the diamond comprising diamond layer 4' increases, observed by more positive diamond Raman peak shift, suggesting a more compressive stress.

As shown in FIG. 1, layers of diamond 4 and 4' may be deposited or formed on both sides of composite layer 6. Also or alternatively, diamond layers 4 and/or 4' may be applied to all sides of composite layer 6 that comprises diamond and silicon carbide, and, optionally, silicon. Different applications may call for this type of multilayer substrate 2.

Example 6

High Stress Diamond Layer 4 CVD Grown on a Composite Layer 6' of Reaction-Bonded Silicon Carbide, and, Possibly, Silicon without Diamond Particles (Control)

It is believed that diamond layer 4 grown on a composite layer 6' of reaction-bonded silicon carbide, and, possibly, silicon without the addition of diamond particles to composite layer 6', working as a control, should have high stress, and should show a higher Raman peak shift in a Raman spectroscopy study. Accordingly, a piece of control composite layer 6' of silicon carbide and, possibly, silicon (no diamond) was used in a control experiment. In this control experiment, the piece of composite layer 6' was placed on a substrate holder of a microwave plasma CVD reactor. A mixture of 1850 mL/min hydrogen and 13.7 mL/min methane was flowed into the microwave plasma CVD reactor. After initiating the plasma, the microwave power and the reactor pressure were tuned so that the plasma size covered the control composite layer 6', and the composite layer 6' temperature was controlled at 820° C. by cooling the substrate holder. After about 112 hours of CVD growth of diamond layer 4 on composite layer 6', the CVD reaction was stopped, and composite layer 6' with diamond layer 4 thereon was removed from the microwave plasma CVD reactor and identified as substrate 1A178 (FIGS. 15A-15E). Diamond layer 4 of substrate 1A178, having a thickness of about 180 microns on composite layer 6' (which is comprised of silicon carbide and possibly silicon with no diamond particle added), was analyzed by optical microscope and Raman scattering spectroscopy at five different locations.

FIGS. 15A-15E show the Raman spectra of substrate 1A178 at five different locations, center, north edge, east edge, south edge, and west edge. The diamond signature Raman peaks are located at 1335.03 $cm^{-1}$, 1335.33 $cm^{-1}$, 1334.52 $cm^{-1}$, 1334.56 $cm^{-1}$, 1334.56 $cm^{-1}$, respectively, with an average of 1334.80 $cm^{-1}$. The Raman peak widths (full-width-half-maximum, FWHM) are 4.71 $cm^{-1}$, 3.64 $cm^{-1}$, 3.71 $cm^{-1}$, 3.84 $cm^{-1}$, and 4.17 $cm^{-1}$, with an average of 4.01 $cm^{-1}$ (a quality as good as that of a single crystal diamond which has a Raman peak FWHM of 4.04 $cm^{-1}$), the baselines of these Raman spectra are very flat, and the signature of $sp^2$ carbon-carbon bonding which associates with graphitic carbon in nature is not detectable. Therefore, the quality of diamond layer 4 of substrate 1A178 is high and uniform throughout its surface.

By comparing the Raman spectrum of a natural single crystal diamond (FIG. 15F) and the Raman spectra of the diamond of diamond layer 4 of substrate 1A178 (FIGS. 15A-15E) with all these Raman spectra being acquired substantially at the same time, it can be confirmed that the quality of diamond layer 4 of substrate 1A178 is good, but that the stress of the diamond of diamond layer 4 of the substrate 1A178 is substantially higher than that for the diamond layer 4 substrates 1A175, 1A177B, and 1A177A (discussed above), evidenced by diamond layer 4 of substrate 1A178 having higher Raman peak shifts from natural single crystal diamond's Raman peak (1331.91 $cm^{-1}$), +3.12 $cm^{-1}$ in the center, +3.42 $cm^{-1}$ in the north edge, +2.61 $cm^{-1}$ in the east edge, +2.65 $cm^{-1}$ in the south edge, and +2.65 $cm^{-1}$ in the west edge, with an average of +2.89 $cm^{-1}$, while Raman peak shifts of the diamond layers 4 of substrates 1A175, 1A177B, and 1A177A is lower: +0.45 $cm^{-1}$ for 1A175, +1.20 $cm^{-1}$ for 1A177B, and 0.72 $cm^{-1}$ for 1A177A.

The Raman shift observed for substrate 1A178 are exciting since they confirm that the multilayer substrate 2 comprising a diamond layer 4 and a composite layer 6, comprised of diamond, silicon carbide, and, optionally, silicon is unique, unexpected, and highly valuable for different applications.

The present invention has been described with reference to the accompanying figures. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A multilayer substrate comprising:
    a composite layer comprised of diamond particles and silicon carbide particles; and
    a chemical vapor deposition (CVD) grown diamond layer on the composite layer, wherein diamond of the diamond layer is CVD grown on crystal surfaces of the diamond particles and/or the silicon carbide particles comprising the composite layer, wherein the diamond layer comprises polycrystalline diamond, wherein the composite layer is comprised of silicon articles.

2. The multilayer substrate of claim 1, wherein the diamond layer is one of the following:
    un-doped;
    doped with an n-type element or compound;
    doped with a p-type element or compound; or
    doped with boron.

3. The multilayer substrate of claim 1, wherein the diamond layer is patterned or selectively etched.

4. The multilayer substrate of claim 1, wherein the diamond particles in the composite layer have a concentration gradient in the composite layer between 0% and 100%.

5. The multilayer substrate of claim 1, wherein a loading level (by volume) of diamond particles in the composite layer is one of the following:
    ≥5%;
    ≥20%;
    ≥40%; or
    ≥60%.

6. The multilayer substrate of claim 1, wherein a thickness of the diamond layer is one of the following:
    between $10^{-9}$ meters and $10^{-6}$ meters;
    between $5 \times 10^{-6}$ meters and $20 \times 10^{-3}$ meters;
    between $500 \times 10^{-6}$ meters and $10 \times 10^{-3}$ meters;
    between $1 \times 10^{-6}$ meters and $5 \times 10^{-3}$ meters;
    between $3 \times 10^{-6}$ meters and $3 \times 10^{-3}$ meters;
    between $50 \times 10^{-6}$ meters and $50 \times 10^{-2}$ meters;
    between $100 \times 10^{-6}$ meters and $10 \times 10^{-2}$ meters;

between 200×10⁻⁶ meters and 5×10⁻² meters; or between 500×10⁻⁶ meters and 2×10⁻² meters.

7. The multilayer substrate of claim 1, wherein a thickness of the multilayer substrate is one of the following:
≥$200\times10^{-6}$ meters;
≥$20\times10^{-3}$ meters;
≥$40\times10^{-3}$ meters;
≥$75\times10^{-3}$ meters;
≥$50\times10^{-6}$ meters;
≥$500\times10^{-6}$ meters; or
≥$1\times10^{-3}$ meters.

8. The multilayer substrate of claim 1, wherein the multilayer substrate has one of the following shapes or a combination of two or more of the following shapes:
circle,
square,
rectangle,
polygon,
ellipse,
curve,
sphere,
aspheric,
cylinder,
cone,
concave, or
convex.

9. The multilayer substrate of claim 1, wherein a surface of the diamond layer is grown or polished to desired roughness and flatness values.

10. The multilayer substrate of claim 1, configured for use as one of the following:
an optical device;
a detector for detecting high energy radiation particles;
a detector for detecting electromagnetic waves;
a device for cutting, drilling, machining, milling, lapping, polishing, coating, bonding, or brazing;
a braking device;
a seal;
a heat conductor;
an electromagnetic wave conducting device;
a chemically inert device configured for use in a highly corrosive environment, a strong oxidizing environment, or a strong reducing environment, at an elevated temperature, or under a cryogenic condition; or
a device for polishing or planarization of semiconductor device, wafer or film, an optical device, wafer or film, and or an electronic device, wafer or film.

11. The multilayer substrate of claim 10, wherein the optical device is either a planar optic or a non-planar optic.

12. The multilayer substrate of claim 11, wherein the planar optic is a mirror or a lens.

13. The multilayer substrate of claim 11, wherein the non-planar optic is spherical, or aspheric, or a cone, or a cylinder.

14. The multilayer substrate of claim 10, wherein the optical device includes an optical coating for management of electromagnetic waves.

15. A method of forming the multilayer substrate of claim 1 comprising:
(a) forming a composite layer comprised of diamond particles and silicon carbide particles and silicon particles;
(b) positioning the composite layer on a substrate holder of a reactor; and
(c) growing a diamond layer on the composite layer positioned on the substrate holder in the reactor, wherein diamond of the diamond layer grows directly on crystal surfaces of the diamond particles comprising the composite layer, wherein the diamond layer comprises polycrystalline diamond.

16. The method of claim 15, wherein step (c) includes growing the diamond layer on the composite layer via chemical vapor deposition.

17. The method of claim 15, wherein step (a) further includes machining, lapping polishing, cutting, or drilling the composite layer.

* * * * *